United States Patent [19]
Tang

[11] Patent Number: 5,892,404
[45] Date of Patent: Apr. 6, 1999

[54] LINEAR POWER AMPLIFIER WITH A PULSE DENSITY MODULATED SWITCHING POWER SUPPLY

[75] Inventor: Engne Tang, Lexington, Mass.

[73] Assignee: VAC-com, Inc., Burlington, Mass.

[21] Appl. No.: 847,023

[22] Filed: May 1, 1997

Related U.S. Application Data

[60] Provisional application No. 60/016,607 filed May 1, 1996.

[63] Continuation-in-part of Ser. No. 708,306, Sep. 4, 1996, abandoned, which is a continuation of Ser. No. 329,078, Oct. 25, 1994, Pat. No. 5,554,959.

[51] Int. Cl.⁶ ..................................................... H03F 3/04
[52] U.S. Cl. .......................... 330/297; 330/202; 330/267
[58] Field of Search ..................................... 330/123, 137, 330/202, 267, 273, 297

[56] References Cited

U.S. PATENT DOCUMENTS 4,507,619  3/1985  Dijkstra et al. .......................... 330/297

*Primary Examiner*—James B. Mullins
*Attorney, Agent, or Firm*—Pandiscio & Pandiscio

[57] ABSTRACT

A linear power amplifier having a pulse density modulated switching power supply including a power supply providing at least a relatively high DC voltage output; a voltage amplifier connected to an external signal source to amplify a relatively low voltage signal received from the external signal source into a relatively high voltage signal; a current amplifier connected to the voltage amplifier to increase the current flow associated with the relatively high voltage signal, as needed, in order to properly drive a load, wherein the current amplifier is powered by a pulse generator. The pulse generator is connected to a first line carrying the relatively high voltage signal to the load, and to a second line supplying power to the current amplifier. The pulse generator (i) compares the instantaneous voltage amplitude of the relatively high voltage signal with the instantaneous voltage level powering the current amplifier, (ii) provides fixed duration pulses, at the relatively high DC voltage, to power the current amplifier whenever, and so long as, the instantaneous voltage amplitude of the relatively high voltage signal rises high enough relative to the instantaneous voltage level powering the current amplifier to cause the current amplifier to approach saturation, (iii) compares the instantaneous voltage level powering the current amplifier with an internal reference voltage standard, and (iv) provides fixed duration pulses at the relatively high DC voltage to power the current amplifier whenever, and for so long as, the instantaneous voltage level powering the current amplifier is less than the internal reference voltage standard.

14 Claims, 14 Drawing Sheets

5,892,404

LINEAR POWER AMPLIFIER WITH A PULSE DENSITY MODULATED SWITCHING POWER SUPPLY

This is a continuation-in-part of U.S. patent application Ser. No. 08/708,306 filed Sep. 4, 1996 by Engne Tang entitled A LINEAR POWER AMPLIFIER WITH A PULSE DENSITY MODULATED SWITCHING POWER SUPPLY, now abandoned, which application in turn is a continuation of U.S. patent application Ser. No. 08/329,078, filed Oct. 25, 1994 by Engne Tang entitled A LINEAR POWER AMPLIFIER WITH A PULSE DENSITY MODULATED SWITCHING POWER SUPPLY (now U.S. Pat. No. 5,554,959). This application also claims the benefit of U.S. provisional patent application Ser. No. 60/016,607 filed May 1, 1996 by Engne Tang entitled A LINEAR POWER AMPLIFIER WITH A PULSE DENSITY MODULATED SWITCHING POWER SUPPLY.

FIELD OF THE INVENTION

This invention relates to amplifiers in general, and more particularly to linear power amplifiers.

BACKGROUND OF THE INVENTION

Linear power amplifiers are well known in the art. In general, these devices serve to provide voltage gain and/or current gain to a relatively low level input signal. Linear power amplifiers have a wide variety of applications, such as servo-control, cathode ray tube deflection, audio frequency signal amplification, electric motor drivers, etc. Unfortunately, many prior art linear power amplifiers suffer from various deficiencies, including high power consumption and high heat generation.

Many prior art linear power amplifiers utilize a multi-stage design. First, the low level input signal (e.g. from a microphone amplifier, a CD player, a computer sound card, etc.) is fed into a voltage amplifier. The low level input signal experiences a voltage gain when it passes through the voltage amplifier. The voltage-amplified signal is then passed through a current amplifier. The signal experiences a current gain when it passes through the current amplifier. The voltage-amplified and current-amplified signal is then applied to a load such as a loudspeaker.

With prior art multi-stage linear power amplifiers, it has been found that so long as the voltage amplitude of the signal being applied to the current amplifier remains below a certain level vis-à-vis the voltage powering the current amplifier, the current amplifier will not saturate, and the linear power amplifier will be able to power the load without degradation of the signal. However, when the voltage amplitude of the signal applied to the current amplifier rises high enough relative to the level of the voltage powering the current amplifier, the current amplifier will saturate, thereby clipping the output signal voltage and limiting the current output to the load.

Typically, this problem is avoided by simply boosting the level of voltage powering the current amplifier so as to eliminate clipping. Unfortunately, this solution has the effect of increasing the power consumed by the linear power amplifier and, consequently, increasing the heat generated by the various amplifier components. This results in the need to apply additional heat sinks to the linear power amplifier, which increase its size and cost.

Other prior art power amplifiers have been proposed to minimize the foregoing problems associated with linear power amplification. For example, in U.S. Pat. No. 4,042, 890 issued Aug. 16, 1977 to Eckerle, a power amplifier is disclosed which uses a signal processor to control the state of a controllable switch. The switch gates the output of a source of relatively high AC voltage. The Eckerle amplifier can be used to drive a wide variety of loads. However, the Eckerle type of circuit requires intermediate analog-to-digital conversion of the original signal, which add to its complexity.

OBJECTS OF THE INVENTION

Accordingly, one object of the present invention is to provide an improved linear power amplifier.

Another object of the present invention is to provide a linear power amplifier that provides a desired increase in power with relatively low heat generation.

Yet another object of the present invention is to provide a linear power amplifier that provides a desired increase in power with very low noise, particularly at low input signal voltage levels.

Another object of the present invention is to provide a switching power supply that provides power to an associated linear power amplifier at a very high speed, whereby the amplifier can provide power to a dynamic load at a very high speed.

Another object of the present invention is to provide a linear power amplifier having a pulsed power supply, wherein the pulses have a fixed time duration, i.e., a fixed width.

Yet another object of the present invention is to provide a linear power amplifier having a pulsed power supply, wherein the pulses have a fixed amplitude.

Still another object of the present invention is to provide a linear power amplifier having a pulsed power supply, wherein the pulses are generated in accordance with the instantaneous voltage amplitude of the signal being applied to the load, and hence in accordance with the power to be consumed by that load.

A further object of the present invention is to provide a linear power amplifier having a pulsed power supply, wherein the density of the pulses (i.e., the frequency of the pulses) varies in accordance with the instantaneous voltage amplitude of the signal being applied to the load, and hence in accordance with the power to be consumed by that load.

Still another object of the present invention is to provide a linear power amplifier having a pulsed power supply, wherein the pulsed power supply is capable of delivering in excess of one million pulses per second.

Another object of the present invention is to provide a linear power amplifier that includes a pulsed power supply and has a very high signal-to-noise ratio.

Yet another object of the present invention is to provide a linear power amplifier that includes a switching power supply and has very low switching noise at low input signal voltage levels.

Still a further object of the present invention is to provide a linear power amplifier having very low harmonic distortion over the entire audio frequency bandwidth and at various power output levels.

Another object of the present invention is to provide a linear power amplifier that provides linear power amplification with improved power efficiency.

A further object of the present invention is to provide a linear power amplifier that is particularly well adapted for audio frequency applications.

Another object of the present invention is to provide an improved method for amplifying a voltage-varying signal.

SUMMARY OF THE INVENTION

These and other objects of the present invention are achieved by the provision and use of a novel linear power amplifier having a pulse density modulated switching power supply. This linear power amplifier generally comprises conventional power supply means, voltage amplifying means, current amplifying means and pulse generating means.

The conventional power supply means may be of either a single or a dual polarity type conventionally interconnected to a source of AC or DC voltage. Further, the conventional power supply means may be adapted to provide either a single relatively high DC voltage output, or both a relatively high DC voltage output and a relatively low DC voltage output. As will appear more fully below, the selection of the conventional power supply means will depend upon the requirements of the particular embodiment of the linear power amplifier of the present invention which is selected for use.

The voltage amplifying means may comprise any of the many linear voltage amplifiers well known in the art having its input connected to an external signal voltage source. The voltage amplifying means are adapted to amplify a relatively low voltage signal received from the external signal voltage source into a relatively high voltage signal. The voltage amplifying means are powered by the relatively high DC voltage output supplied by the conventional power supply means.

The current amplifying means comprise any of the many current gain transistors well known in the art for driving a load (particularly, complex reactance loads and loads with characteristics which change with frequency and the like). The current amplifying means are connected between the voltage amplifying means and the load, and are adapted to boost the current flow associated with the relatively high voltage signal received from the voltage amplifying means, as needed, in order to properly drive the load. The current amplifying means may be powered either by a relatively low DC voltage supplied by the conventional power supply means and by the pulse generating means, or by the pulse generating means alone as will be discussed in further detail below.

The pulse generating means are connected to the output of the linear amplifier, and to the power input of the current amplifying means.

In one embodiment of the invention, the pulse generating means comprise a high speed switch, a power switch, a compensation network and a pulse filter.

More particularly, in this embodiment, the high speed switch is adapted to monitor the instantaneous voltage differential between (i) the relatively high voltage signal generated by the voltage amplifying means, and (ii) the input powering the current amplifying means. The high speed switch changes states when the voltage amplitude of the relatively high voltage signal rises high enough vis-à-vis the level of the voltage powering the current amplifying means to cause the current amplifying means to approach saturation. Specifically, the high speed switch is chosen so that it changes states before the current amplifying means reaches saturation, thereby avoiding clipping of the output signal of the linear power amplifier so as to limit the current output to the load.

The power switch is adapted to provide a high voltage pulse to power the current amplifying means in response to a change in state of the high speed switch. In particular, the power switch provides high voltage pulses to the power input of the current amplifying means whenever, and so long as, the high speed switch senses that the current amplifying means are approaching saturation.

The compensation network is disposed between the voltage amplifying means and the high speed switch. The compensation network comprises appropriately chosen resistor and capacitor components for (i) correcting unwanted phase shifts induced by the pulse generating means, and (ii) conditioning one of the inputs to the high speed switch (i.e., the relatively high voltage signal generated by the voltage amplifying means) so that the high speed switch will fire at the proper moment.

The pulse filter is connected between the output of the power switch and the power input of the current amplifying means so as to condition the waveform of the high voltage pulse provided by the pulse generating means prior to the application of that pulse to the power input of the current amplifying means.

In an alternative embodiment of the invention, the pulse generating means comprise a voltage monitor with bi-state impedance, a high speed switch, a power switch, a compensation network and a pulse filter.

The voltage monitor with bi-state impedance is used to monitor the instantaneous voltage differential between (i) the relatively high voltage signal generated by the voltage amplifying means, and (ii) the input voltage powering the current amplifying means. The voltage monitor with bi-state impedance changes its state of impedance when the voltage amplitude of the relatively high voltage signal rises high enough vis-à-vis the level of the voltage powering the current amplifying means to cause the current amplifying means to approach saturation. Specifically, the voltage monitor with bi-state impedance is chosen so that it will change states before the current amplifying means reach saturation, thereby avoiding clipping of the output signal of the linear power amplifier so as to limit the current output to the load.

The high speed switch is responsive to changes in the impedance state of the voltage monitor.

The power switch is adapted to provide a high voltage pulse to power the current amplifying means in response to a change in state of the high speed switch. In particular, the power switch provides high voltage pulses to the power input of the current amplifying means whenever, and so long as, the voltage monitor with bi-state impedance determines that the current amplifying means are approaching saturation.

The compensation network is disposed (i) between the voltage amplifying means and the voltage monitor with bi-state impedance, and (ii) between the voltage amplifying means and the high speed switch. The compensation network comprises appropriately chosen resistor and capacitor components which provide a preselected bias to the voltage monitor with bi-state impedance and set the operating point of the high speed switch. Furthermore, the compensation network corrects for unwanted phase shifts induced by the pulse generating means and prepares the high speed switch for firing at the proper moment.

The pulse filter is connected between the output of the power switch and the power input of the current amplifying means so as to condition the waveform of the high voltage pulses provided by the pulse generating means prior to their application to the power input of the current amplifying means.

In each of the foregoing embodiments of the invention, it is contemplated that a conventional power supply means having both a relatively high DC voltage output ($V_{DC1}$) and a relatively low DC voltage output ($V_{DC2}$) will be used. In these embodiments of the invention, the voltage amplifying means at all times is powered directly by the relatively high DC voltage output ($V_{DC1}$) of the power supply. Further, the current amplifying means is powered by the relatively low DC voltage ($V_{DC2}$), but is adapted to receive powering pulses of the relatively high voltage output level ($V_{DC1}$) from the pulse generating means whenever, and so long as, those pulses are needed to prevent the current amplifying means from saturating.

The cost of power supply means having both a relatively high DC voltage output and a relatively low DC voltage output is significant. Accordingly, in yet another embodiment of the invention, a less expensive conventional power supply having a single, relatively high DC voltage output is used. In this embodiment of the invention, the pulse generating means comprise a voltage monitor, a high speed switch, a power switch, a compensation network and a pulse filter substantially as discussed above. In addition, the high speed switch is provided with a preselected internal reference voltage standard.

Accordingly, as long as the current amplifying means does not approach saturation and the voltage level at the input of the high speed switch (which is in proportion to the voltage at the power input of the current amplification means when the current amplification means is not in saturation) is greater than the internal reference voltage standard, the high speed switch does not change state and no relatively high voltage pulse is applied the power input of the current amplifying means. However, if the current amplification means approaches saturation, or the voltage level at the input of the high speed switch drops to a level less than the preselected voltage level of the internal reference voltage standard, the high speed switch changes state and a high voltage pulse is applied by the power switch to the power input of the current amplifying means. Therefore, the pulse generating means of this embodiment of the invention not only avoids the voltage signal clipping and current output limiting problems alluded to above, but also acts so as to power the current amplifying means at an average, substantially constant preselected voltage (for example, $V_{DC2}$) during periods of low signal level or periods of no input signal. Further details of this are illustratively shown in FIG. 14.

Consequently, it will be understood that the pulse generating means (1) compare the instantaneous voltage amplitude of the relatively high voltage signal with the instantaneous level of voltage powering the current amplifying means, and (2) provide fixed duration pulses (at the relatively high DC voltage, $V_{DC1}$) to power the current amplifying means whenever, and so long as the instantaneous voltage amplitude of a relatively high voltage signal rises high enough vis-à-vis the corresponding instantaneous level of the voltage powering the current amplifying means as to cause the current amplifying means to approach saturation. Further, the same pulse generating means maintain an average, substantially constant, desired voltage level at the powering input of the current amplifying means between relatively high voltage signals by way of relatively high voltage pulses, instead of a direct connection of the powering input of the current amplifying means to a fixed low DC voltage from the power supplying means (in the same way as used in the first embodiment).

It, of course, will be understood that the pulse generating means are adapted to provide pulses at the relatively high DC voltage level ($V_{DC1}$) in sufficient number and with sufficient frequency to prevent the current amplifying means from ever reaching saturation. In other words, the circuitry is designed in such a way that the constantly changing amplitude of a high voltage signal applied to the current amplification means is always compared to the corresponding voltage on the discharge curve of the high voltage pulse last applied to the power input of the current amplification means so as to always avoid current amplification means saturation. In addition, the circuit creates and regulates a fixed DC voltage to power the current amplifying means whenever the level of the relatively high voltage signal is sufficiently lower than the fixed DC voltage so that the current amplifying means does not approach saturation. Further, it will be evident to those skilled in the art that the level of the relatively high DC voltage ($V_{DC1}$) is contemplated to be greater than the maximum voltage amplitude of the relatively high voltage signal by an amount exceeding the voltage differential which would cause current amplification means saturation.

BRIEF DESCRIPTION OF THE DRAWINGS

These and other objects, features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF PREFERRED EMBODIMENTS

Figure 1:
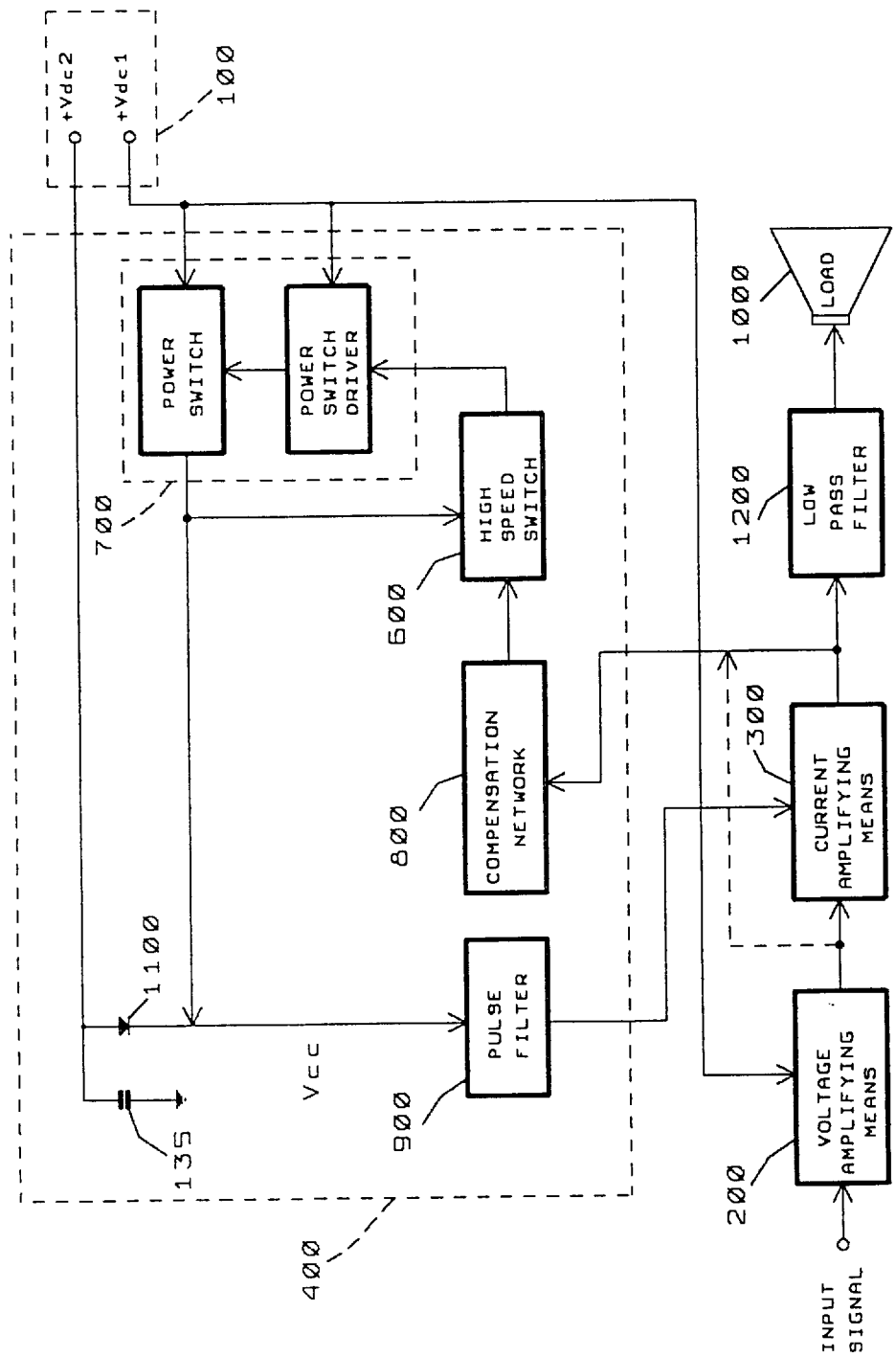
FIG. 1 is a block diagram of a first exemplary embodiment of a linear power amplifier with a pulse density modulated switching power supply formed in accordance with the present invention.

Referring first to FIG. 1, the embodiment of the present invention therein shown comprises power supply means 100, voltage amplifying means 200, current amplifying means 300 and pulse generating means 400.

Pulse generating means 400 generally comprise a high speed switch 600, a power switch 700, a compensation network 800 and a pulse filter 900.

Power supply means 100 may comprise either a single polarity or a dual polarity electrical power supply. For example, the AC voltage provided by a conventional power main, or a DC voltage source, may be used with the present invention. In this embodiment, a dual polarity power source (see, for example, FIG. 2) is utilized to provide four output voltages, i.e., the (+) and (−) of a relatively high DC voltage (hereinafter referred to as $V_{DC1}$) and the (+) and (−) of a relatively low DC voltage (hereinafter referred to as $V_{DC2}$).

$V_{DC1}$ is the voltage that powers voltage amplifying means 200 so as to provide high voltage swing to drive current amplifying means 300, as will hereinafter be disclosed in further detail. $V_{DC1}$ is also the voltage that powers current amplifying means 300 when pulse generating means 400 supply a power pulse to current amplifying means 300, as will hereinafter be discussed in further detail.

$V_{DC2}$ is the voltage that powers current amplifying means 300, except when pulse generating means 400 are supplying a power pulse (of fixed duration and at the voltage level $V_{DC1}$) to current amplifying means 300, as will hereinafter be discussed in further detail.

Stated another way, (+) and (−) $V_{CC}$ is the voltage (hereinafter referred to simply as $V_{CC}$) that powers current amplifying means 300 through pulse filter 900 of the linear power amplifier. $V_{CC}$ is normally equal to the relatively low DC voltage $V_{DC2}$. However, $V_{CC}$ may be increased to $V_{DC1}$ by pulse generating means 400 when the same is required in order to keep current amplifying means 300 out of saturation. Accordingly, the linear power amplifier can always fully power a load 1000 (e.g. a loudspeaker), without any clipping of the signal, as will hereinafter be disclosed in further detail.

$V_{DC1}$ is chosen so as to be high enough, relative to the maximum anticipated voltage amplitude of the relatively high voltage signal, to prevent current amplifying means 300 from ever reaching saturation when current amplifying means 300 are powered by $V_{DC1}$. The maximum anticipated voltage amplitude is determined by the maximum output power of an amplifier, which is normally stated by the amplifier manufacturer for commercial purposes. However, $V_{DC1}$ also is chosen such that it applies no more voltage to current amplifying means 300 than is absolutely necessary in order to fully power load 1000.

$V_{DC2}$, on the other hand, is chosen so as to be high enough, relative to the maximum anticipated voltage amplitude of the relatively high voltage signal, to alone power current amplifying means 300 a good deal of the time without saturation occurring. However, for reducing the power dissipation of the current amplifying means, $V_{DC2}$ also is chosen so as to be low enough to apply as little voltage as possible to current amplifying means 300 when it is powering load 1000.

It will be understood by those skilled in the art that in the following circuits the various components may be arranged so as to operate at (+) $V_{DC1}$ and (+) $V_{DC2}$, or to operate at (−) $V_{DC1}$ and (−) $V_{DC2}$, or both. For simplicity of description, the illustrative circuits in accordance with the present invention discussed hereinafter assume single polarity, positive voltages. It also should be specifically understood, however, that the scope of the present invention extends to various circuits of the type described, operating on either positive or negative voltages, or both.

Voltage amplifying means 200 comprise a sensitive, high gain voltage amplification circuit. In the preferred embodiments of the invention, voltage amplifying means 200 may be adapted to provide low noise voltage amplification of audio-frequency signals received from an audio device, e.g. from a microphone amplifier, a CD player, a computer sound card, etc.

Current amplifying means 300 comprise current gain transistors or the like which are driven by the output of voltage amplifying means 200. Current amplifying means 300 boost the current flow associated with the relatively high voltage signal received from voltage amplifying means 200, as needed, in order to properly drive load 1000.

Pulse generating means 400 are connected to the output of current amplifying means 300 (or, if preferred, to the output of voltage amplifying means 200). Pulse generating means 400 (i) compare the instantaneous voltage amplitude of the relatively high voltage signal with the instantaneous level of the voltage powering current amplifying means 300, and (ii) provide fixed duration pulses at the high voltage $V_{DC1}$ whenever, and so long as, the instantaneous voltage amplitude of the relatively high voltage signal is high enough vis-à-vis the instantaneous level of the voltage powering current amplifying means 300 to cause the current amplifying means to approach saturation.

To this end, pulse generating means 400 comprise a high speed switch 600 which cycles between two distinct states. More particularly, high speed switch 600 has a first state corresponding to a switch "off" position. The switch "off" position is maintained so long as the instantaneous amplitude of the relatively high voltage signal remains sufficiently far below the instantaneous voltage of the input powering current amplifying means 300 to keep the current amplifying means out of saturation. In other words, high speed switch 600 remains in its "off" position so long as the difference between (i) the instantaneous voltage amplitude of the output of current amplifying means 300 (or voltage amplifying means 200) and (ii) the instantaneous voltage level powering current amplifying means 300 (i.e., $V_{CC}$) is greater than, or equal to, some predetermined value, where that predetermined value is carefully chosen to ensure that current amplifying means 300 remain out of saturation.

High speed switch 600 also has a second state corresponding to a switch "on" position. This switch "on" position is induced when the instantaneous amplitude of the relatively high voltage signal rises high enough relative to the instantaneous voltage level of the input powering current amplifying means 300 to cause the current amplifying means to approach saturation. Hence, high speed switch 600 switches from its switch "off" state to its switch "on" state when the difference between (i) the instantaneous voltage amplitude of the output of current amplifying means 300 (or voltage amplifying means 200) and (ii) the instantaneous level of the voltage powering current amplifying means 300 (i.e., $V_{CC}$) is less than the aforementioned predetermined value.

High speed switch 600 actuates power switch 700 when high speed switch 600 changes from its switch "off" state to its switch "on" state so as to switch $V_{CC}$ rapidly between $V_{DC2}$ and $V_{DC1}$. Thus, power switch 700 also is capable of being in one of two states. The first of these states corresponds to a switch "off" position. Power switch 700 is maintained in its switch "off" state while high speed switch 600 is in its switch "off" state. Further, while power switch 700 is in its switch "off" state, $V_{DC1}$ is obstructed, and $V_{CC}$ is set at $V_{DC2}$.

Power switch 700 also has a switch "on" state. Power switch 700 assumes its switch "on" state when high speed switch 600 cycles to its switch "on" state. In its switch "on" state, power switch 700 causes $V_{CC}$ to rise rapidly to $V_{DC1}$, with high speed diode 1100 (FIGS. 1 and 4) receiving a reverse bias so as to isolate $V_{DC2}$.

Compensation network 800 is disposed between (i) voltage amplifying means 200 (or the output of current amplifying means 300), and (ii) high speed switch 600. Compensation network 800 comprises appropriately chosen resistor and capacitor components for (i) correcting unwanted phase shifts induced by pulse generating means 400, and (ii) conditioning one of the inputs to high speed switch 600 (i.e., the relatively high voltage signal generated by voltage amplifying means 200) so that the high speed switch will fire at the proper moment.

Pulse filter 900 is used to condition the waveform of the high voltage pulse provided by pulse generating means 400 prior to the application of that pulse to the powering input of current amplifying means 300.

The embodiment of the linear power amplifier with pulse density modulated power supply of the present invention shown in FIG. 1 operates as follows. A relatively low voltage signal is received by voltage amplifying means 200. Voltage amplifying means 200 amplify this relatively low voltage signal into a relatively high voltage signal. Voltage amplifying means 200 are powered by $V_{DC1}$, and provide all of the voltage gain applied to the low voltage level signal prior to its driving application to load 1000. In this regard, it is to be noted that the output of voltage amplifying means 200 is applied to current amplifying means 300 so as to power load 1000, via low pass filter 1200.

Pulse generating means 400 continuously compare the instantaneous voltage amplitude of the output signal of current amplifying means 300 (or voltage amplifying means 200) with the instantaneous level of the voltage powering current amplifying means 300. More particularly, the instantaneous voltage amplitude of the output signal of current amplifying means 300 (or voltage amplifying means 200) is continuously compared with the instantaneous level of the voltage powering current amplifying means 300 (i.e., $V_{CC}$) via high speed switch 600. As long as the difference between these two voltage levels remains greater than, or equal to, some predetermined value (i.e., a value sufficient to ensure that current amplifying means 300 are not approaching saturation), high speed switch 600 will remain in its switch "off" state. As a result, power switch 700 will also remain in its switch "off" state, and $V_{CC}$ will remain at $V_{DC2}$. Thus, current amplifying means 300 will be powered by the lower voltage $V_{DC2}$ as long as this lower voltage $V_{DC2}$ is sufficient to keep current amplifying means 300 out of saturation.

If, however, the instantaneous voltage amplitude of the output signal of current amplifying means 300 (or voltage amplifying means 200) rises high enough relative to the instantaneous level of the voltage of the input powering current amplifying means 300 to cause the current amplifying means to approach saturation, high speed switch 600 will immediately change state, from its switch "off" state to its switch "on" state. As soon as high speed switch 600 changes state, from switch "off" to switch "on", power switch 700 also changes state, from switch "off" to switch "on". This causes $V_{CC}$ to instantaneously rise from its normal $V_{DC2}$ level to the higher voltage level $V_{DC1}$. As a result, current amplifying means 300 will be powered by the higher voltage $V_{DC1}$ so as to keep current amplifying means 300 out of saturation.

As soon as $V_{CC}$ rises to $V_{DC1}$, however, the aforementioned difference in voltage values (i.e., between the instantaneous voltage value at the output of voltage amplifying means 200 and the instantaneous level of the voltage value powering current amplifying means 300) will once again exceed the predetermined value tested for by high speed switch 600. As a result, high speed switch 600 will immediately switch back from its switch "on" state to its switch "off" state, thereby causing power switch 700 to also immediately switch back from its switch "on" state to its switch "off" state. Accordingly, $V_{CC}$ immediately settles toward $V_{DC2}$. In essence, then, as soon as the circuit turns itself "on" so as to raise $V_{CC}$ to $V_{DC1}$, the circuit also starts to turn itself "off" so as to restore $V_{CC}$ toward $V_{DC2}$. Thus, a power pulse of very short duration and fixed amplitude $V_{DC1}$ is created whenever the instantaneous voltage amplitude of the relatively high voltage signal rises high enough vis-à-vis the instantaneous level of the voltage powering current amplifying means 300 to cause the current amplifying means to approach saturation.

The system immediately and continuously repeats the foregoing process over and over again to determine if and when another power pulse should be fired.

By choosing appropriate circuit components for use in the above-described circuit, it has been found that it is possible to fire in excess of 1 million pulses per second.

It will be understood, therefore, that current amplifying means 300 will normally be powered by the lower voltage $V_{DC2}$ (for low power dissipation) so long as that lower voltage $V_{DC2}$ is sufficient to keep current amplifying means 300 out of saturation. On the other hand, pulses of very short duration and fixed, higher voltage amplitude $V_{DC1}$ will be applied to the power input of current amplifying means 300 whenever, and as long as, the difference between the instantaneous voltage amplitude of the output signal from current amplifying means 300 (or voltage amplifying means 200) and the instantaneous level of the voltage of the input powering current amplifying means 300 rises above the aforementioned predetermined value, i.e., whenever current amplifying means 300 approach saturation while being powered at the lower voltage $V_{DC2}$. In other words, pulse generating means 400 will generate power pulses whenever, and so long as, the difference between the instantaneous voltage amplitude of the relatively high voltage signal and $V_{CC}$ drops to the point at which current amplifying means 300 approaches saturation. In this way the instantaneous current requirements demanded by load 1000 are met on an extremely efficient basis.

Significantly, the density of high voltage pulses issued to the power input of current amplifying means 300 by pulse generating means 400 is directly proportional to the instantaneous voltage amplitude of the signal being applied to current amplifying means 300 in accordance with the power consumed by the load.

Figure 2:
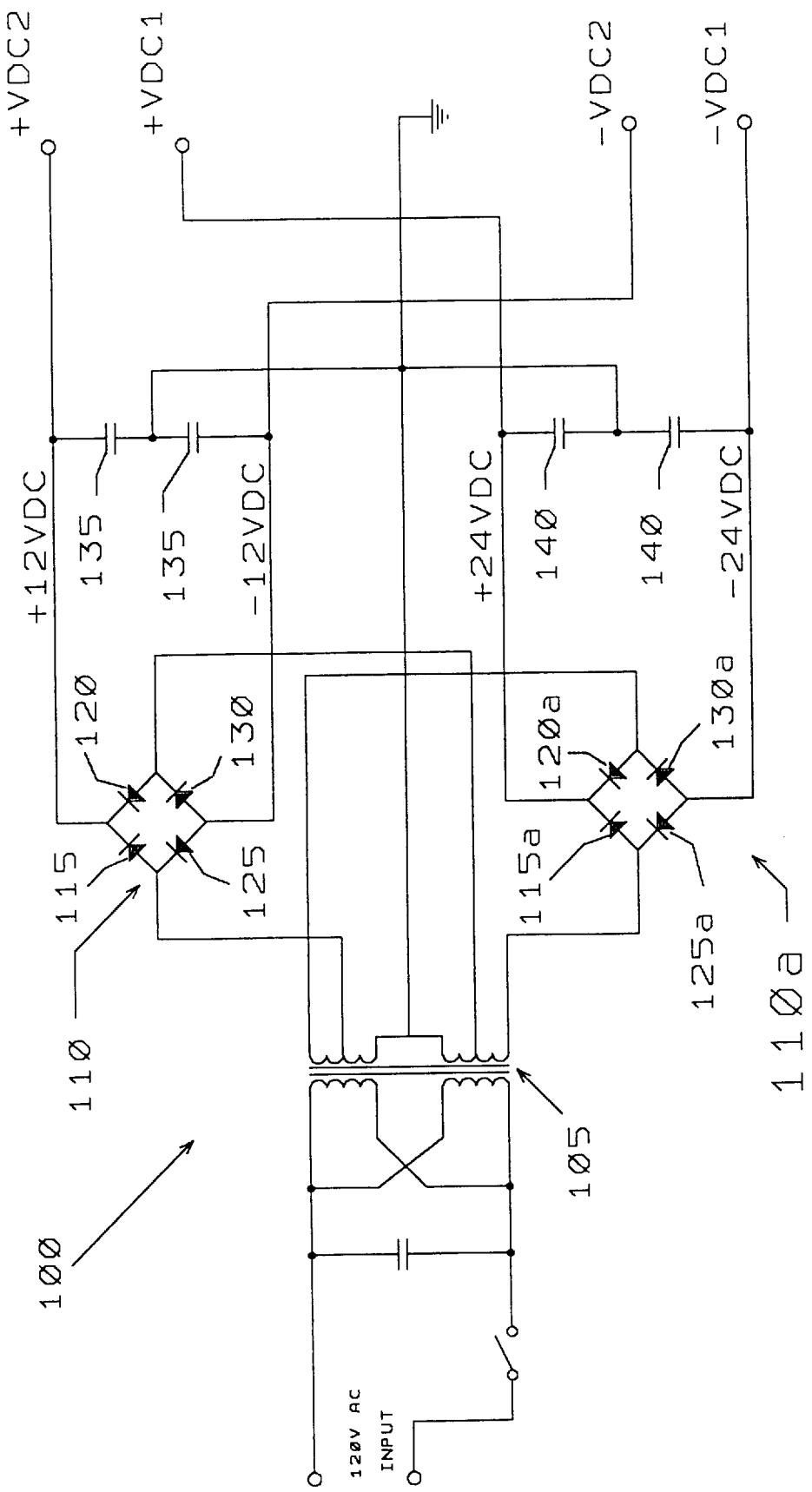
FIG. 2 is a schematic diagram illustrating one form of power supply which may be used with the present invention.
Figure 3:
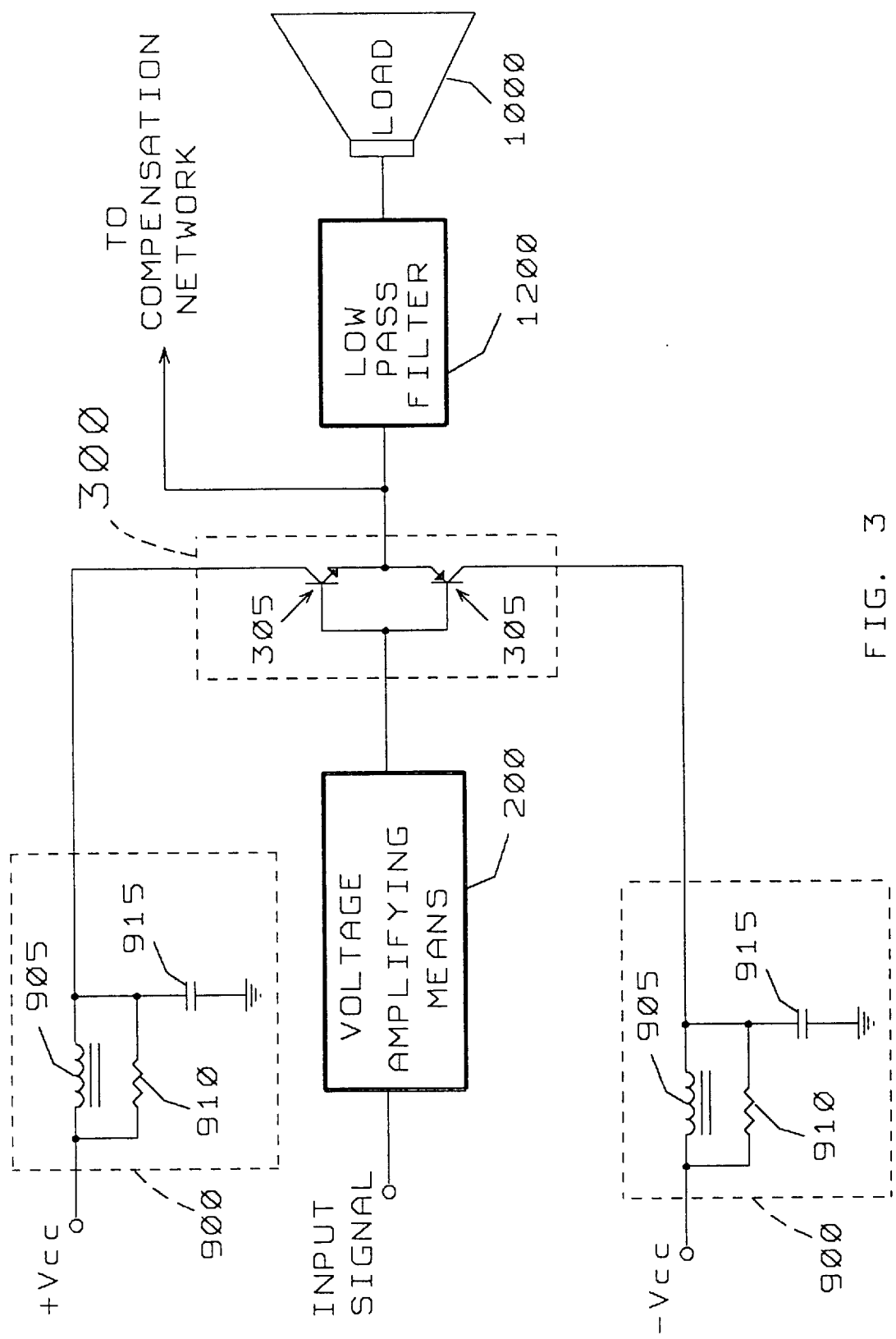
FIG. 3 is a schematic diagram illustrating the voltage amplifying means, the current amplifying means and the pulse filters of the embodiment of the invention depicted in FIG. 1, as connected through a low pass filter to a load.
Figure 4:
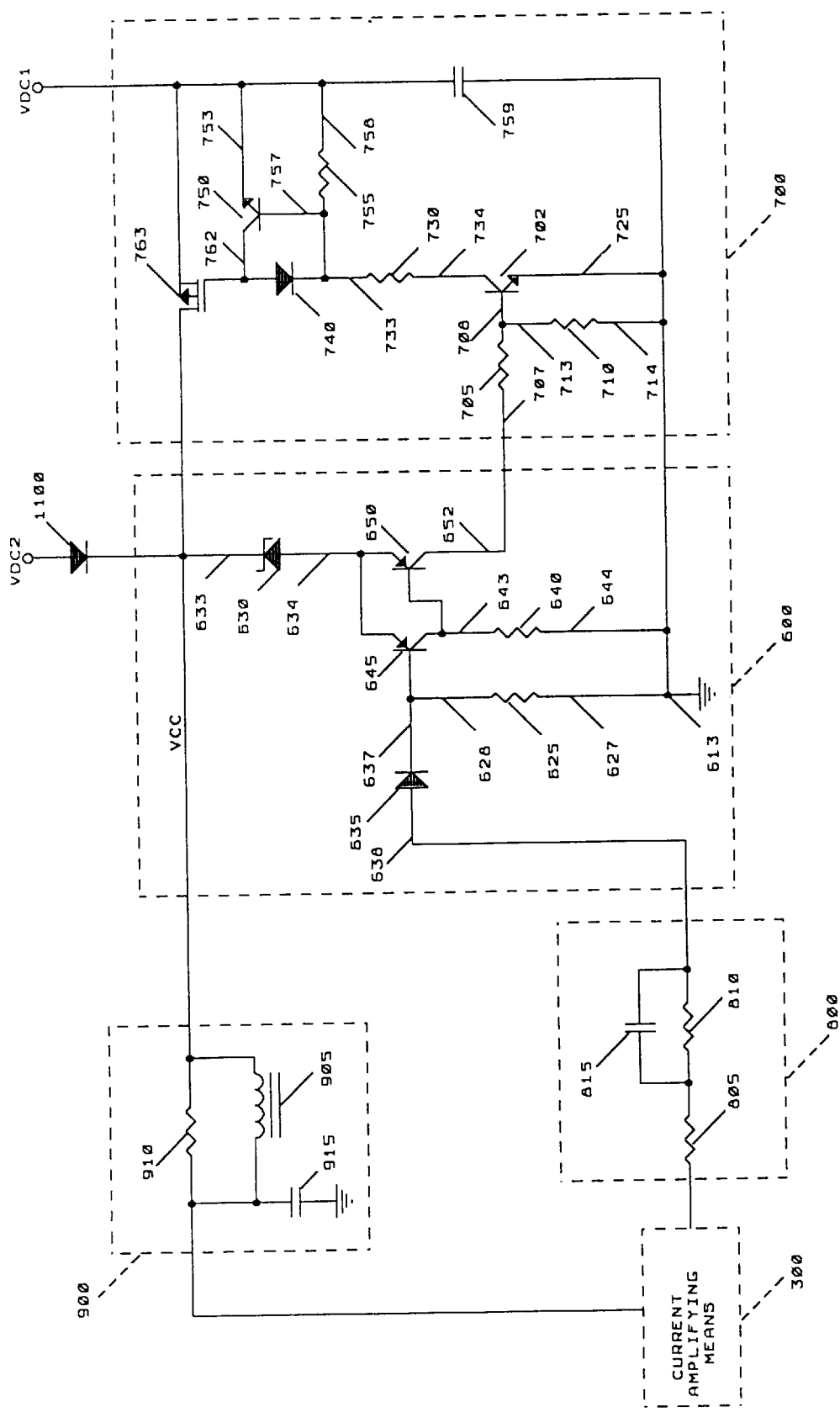
FIG. 4 is a schematic diagram illustrating the current amplifying means, the high speed switch, the power switch, the compensation network and the pulse filter of the embodiment of the invention depicted in FIG. 1.

Further details of the foregoing embodiment of the linear power amplifier with pulse density modulated switching power supply of the present invention are shown in FIGS. 2–4.

In FIGS. 1 and 2, power supply means 100 comprise transformer means 105 for converting AC to DC. Transformer means 105 is typically a 50/60 hz power transformer having dual center tap windings of the sort well known in the art. Transformer means 105 provides $V_{DC1}$ (e.g., 24 volts DC) and $V_{DC2}$ (e.g., 12 volts DC) from a power main or other source of AC voltage. It will be understood that other relative voltage values may be used without departing from the scope of this invention.

A pair of full wave bridge rectifiers 110 and 110a receive the output of transformer means 105. Full wave bridge rectifiers 110 and 110a comprise diodes 115, 120, 125 and 130, and 115a, 120a, 125a and 130a, respectively, as shown in FIG. 2. Capacitors 135 and 140 provide filtering for $V_{DC2}$ and $V_{DC1}$, respectively. Thus, power supply means 100 provides four output voltages, at (+) and (−) $V_{DC1}$ and (+) and (−) $V_{DC2}$.

Turning now to FIGS. 1 and 3, voltage amplifying means 200 preferably comprise a sensitive, high gain voltage amplifier of the sort well known in the art. Voltage amplifying means 200 amplify the voltage component of an input low voltage level signal (such as an audio-frequency signal received from a typical audio signal source, e.g. a microphone amplifier, a CD player, a computer sound card, etc.) Voltage amplifying means 200 are powered by high level voltage, i.e., $V_{DC1}$. Typically, voltage amplifying means 200 may comprise an LM391 voltage amplifier manufactured by National Semiconductor Corporation or a similar voltage amplifier of the sort well known in the art.

Looking next at FIGS. 1, 3 and 4, current amplifying means 300 are driven by voltage amplifying means 200 and provide current gain to the signal powering load 1000. In particular, it should be noted that current amplifying means 300 provide unity voltage gain to the signal powering load 1000. Further, current amplifying means 300 are powered by the voltage $V_{CC}$. $V_{CC}$ is normally set at $V_{DC2}$, except when pulse generating means 400 are supplying a power pulse to the power input of current amplifying means 300. During the latter period, $V_{CC}$ is set at $V_{DC1}$. Current amplifying means 300 may comprise, for example, two current gain transistors 305, e.g. either two MJ15024 or two MJ15025 transistors manufactured by the Motorola Corporation or similar transistors of the sort well known in the art.

Voltage amplifying means 200 and current amplifying means 300 together provide the required voltage swing and high current needed to properly power load 1000.

Looking next at FIGS. 1 and 4, pulse generating means 400 generally comprise high speed switch 600, power switch 700, compensation network 800 and pulse filter 900.

High speed switch 600 comprises a zener diode 630, a diode 635, two resistors 625 and 640, and two transistors 645 and 650. High speed switch 600 is connected as follows. Resistor 625 includes leads 627 and 628. Lead 627 is electrically connected to circuit ground potential 613, and lead 628 is electrically connected to the base of transistor 645. Zener diode 630 comprises leads 633 and 634. Lead 633 is electrically connected to $V_{CC}$, and lead 634 is connected to the emitters of transistors 645 and 650. Resistor 640 comprises leads 643 and 644. Lead 643 is connected to the collector of transistor 645 and to the base of transistor 650. Lead 644 is connected to circuit ground potential 613. Additionally, the base of transistor 645 is also connected to lead 637 of diode 635. Diode 635 is also connected to compensation network 800 via lead 638.

Compensation network 800 comprises two resistors 805 and 810, and a capacitor 815. These elements are arranged so as to place capacitor 815 in parallel electrical relationship with resistor 810. One end of the parallel circuit of capacitor 815 and resistor 810 is connected to resistor 805. The other end of the parallel circuit of capacitor 815 and resistor 810 is connected to lead 638 of diode 635. Resistor 805 is also connected to the output of current amplifying means 300. In a preferred embodiment, the values of capacitor 815 and resistors 805 and 810 are chosen so as to be compatible with an audio-frequency bandwidth of between about 20 hz to about 20 Khz. Of course, however, other applications of the present invention could dictate other values for these components.

Still referring to FIGS. 1 and 4, power switch 700 comprises a transistor 702 and a resistor 705. Collector output lead 652 of transistor 650 is electrically connected to the base of transistor 702 via resistor 705. More particularly, resistor 705 includes leads 707 and 708. A resistor 710 comprises leads 713 and 714. Collector lead 652 of transistor 650 is electrically connected to lead 707 of resistor 705. Lead 708 of resistor 705 is electrically connected to lead 713 of resistor 710 and to the base of transistor 702. Lead 714 of resistor 710 is electrically connected to circuit ground potential 613.

The emitter of transistor 702 (indicated at 725) is electrically connected to circuit ground potential 613. A resistor 730 comprises leads 733 and 734. Lead 734 of resistor 730 is electrically connected to the collector of transistor 702. Lead 733 of resistor 730 is connected to the cathode of a diode 740. Lead 733 of resistor 730 and the cathode of diode 740 are also electrically connected to the base of a transistor 750.

A resistor 755 comprises two leads 757 and 758. Lead 757 is connected to the base of transistor 750, to lead 733 of resistor 730, and to the cathode of diode 740. Lead 758 of resistor 755 is connected to $V_{DC1}$ at a point between $V_{DC1}$ and a capacitor 759. Capacitor 759 is placed between lead 758, $V_{DC1}$ and circuit ground potential 613. Collector lead 753 of transistor 750 is electrically connected to $V_{DC1}$. The emitter lead 762 of transistor 750 is electrically connected to the anode of diode 740 and to the gate of power MOSFET 763. Power MOSFET 763 has its source electrically connected to $V_{DC1}$ and its drain electrically connected to the $V_{CC}$ line.

The foregoing circuit operates as follows. Resistors 625 and 640 regulate the current flowing through high speed switch 600. Zener diode 630 sets the operating voltage for the emitters of transistors 645 and 650, depending on the level of $V_{CC}$. In particular, zener diode 630 is selected so that (i) transistor 645 is in saturation, or "on", and transistor 650 is not in saturation, or "off", when the instantaneous amplitude of the relatively high voltage signal is sufficiently far below the instantaneous level of the voltage of the input powering current amplifying means 300 so as not to cause the current amplifying means to approach saturation, and (ii) transistor 645 is not in saturation, or "off", and transistor 650 is in saturation, or "on", when the instantaneous amplitude of the relatively high voltage signal rises high enough relative to the instantaneous level of the voltage of the input powering current amplifying means 300 so as to cause the current amplifying means to approach saturation. In other words, the breakdown voltage $V_Z$ of zener diode 630 is chosen so that when the voltage at the base of transistor 645 is less than the value ($V_{CC}-V_Z-V_{BE}$), where $V_{BE}$ is the base-to-emitter forward voltage of transistor 645, transistor 645 will be "on", since this condition corresponds to the situation where current amplifying means 300 are not approaching saturation. The breakdown voltage $V_Z$ of zener diode 630 also is chosen so that when the voltage at the base of transistor 645 is greater than the value ($V_{CC}-V_Z-V_{BE}$), transistor 645 will be "off", since this condition corresponds to the situation where current amplifying means 300 are approaching saturation and a power pulse is to be fired by pulse generating means 400.

More particularly, transistor 645 will be "on" and transistor 650 will be "off" as long as the instantaneous output voltage of current amplifying means 300 (or voltage amplifying means 200) remains sufficiently far below the instantaneous level of the voltage of the input powering current amplifying means 300 so as not to cause the current amplifying means to approach saturation. Accordingly, transistor 702 will also be "off", transistor 750 will be "on", and power MOSFET 763 will be "off".

However, when the instantaneous amplitude of the relatively high voltage signal rises high enough relative to the instantaneous level of the voltage of the input powering current amplifying means 300 to cause the current amplifying means to approach saturation, transistor 645 will be switched "off", transistor 650 will be switched "on", and transistor 702 will be switched "on". Further, when transistor 702 turns "on", diode 740 is biased into conduction, and transistor 750 is turned "off". When diode 740 is in conduction, the gate voltage of power MOSFET 763 falls, giving a forward bias to turn "on" power MOSFET 763. When power MOSFET 763 turns "on", $V_{CC}$ rises very quickly to $V_{DC1}$, thereby supplying current amplifying means 300 with the higher voltage needed to prevent signal clipping.

As soon as $V_{CC}$ rises to $V_{DC1}$, however, the instantaneous voltage present at the cathode of zener diode 630 will once again be high enough relative to the instantaneous amplitude of the relatively high voltage signal present at the base of transistor 645 to turn transistor 645 back "on" and transistor 650 back "off". This change in state of high speed switch 600 causes transistor 702 to switch "off" and transistor 750 to switch "on". Hence, power MOSFET 763 returns to its "off" state, thereby permitting $V_{CC}$ to return toward $V_{DC2}$. Accordingly, it will be seen that in effect, at the very moment the circuit boosts $V_{CC}$ so as to keep current amplifying means 300 out of saturation, the circuit starts to turn itself "off" thereby terminating the power pulse.

Thus, with each cycle of high speed switch 600 and power switch 700, a power pulse of approximately 1 microsecond duration, and having a peak amplitude corresponding to $V_{DC1}$, is created. The frequency of the generated pulses is directly related to (i) the instantaneous amplitude of the relatively high voltage signal provided by current amplifying means 300 (or voltage amplifying means 200), and (ii) the instantaneous level of the voltage of the input powering current amplifying means 300. In particular, each time the instantaneous voltage amplitude of the relatively high voltage signal rises to a level that will cause current gain transistors 305 to approach their saturation point, the pulse circuit 400 fires and $V_{CC}$ is very quickly raised to the higher $V_{DC1}$ voltage level. However, as soon as $V_{CC}$ reaches $V_{DC1}$, a large voltage drop occurs across resistor 625, immediately returning transistor 645 to its first "on" state, whereby $V_{CC}$ will return toward $V_{DC2}$. Thus, a 1 microsecond wide pulse of amplitude $V_{DC1}$ is created.

Figure 5:
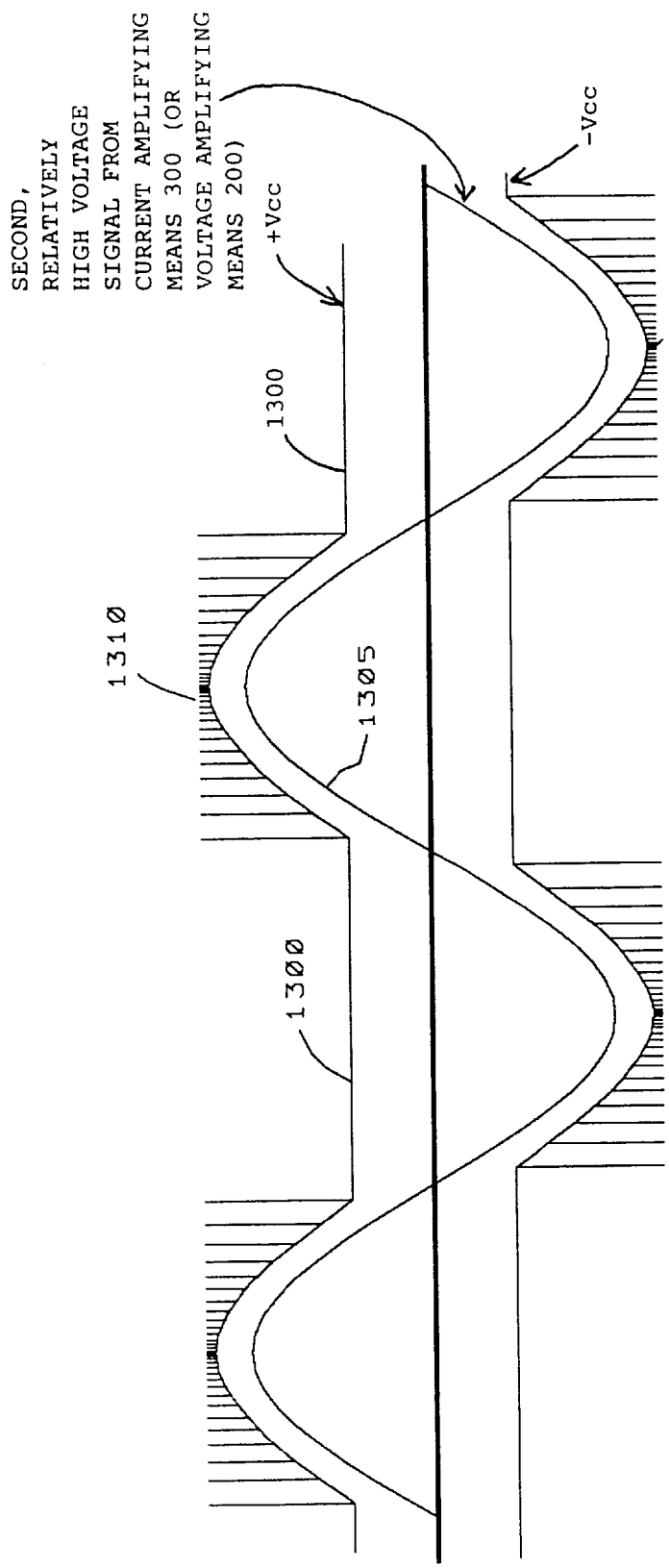
FIG. 5 is a graph relating to the embodiment of the invention depicted in FIG. 1 illustrating (i) the relatively high voltage signal generated by the voltage amplifying means, and (ii) the output of the pulse density modulated switching power supply, with the output of the pulse density modulated switching power supply being shown before passage through the pulse filters.
Figure 6:
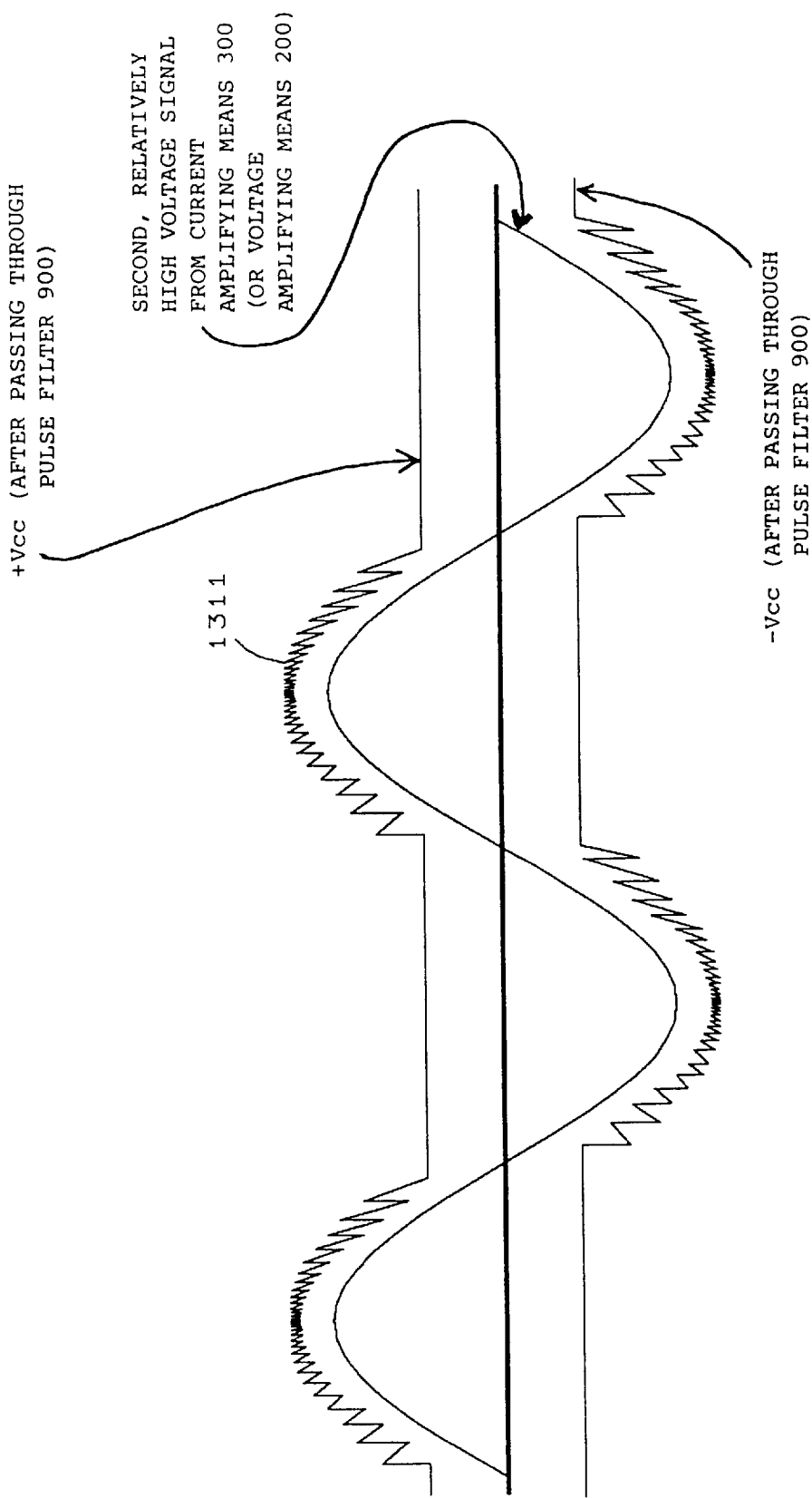
FIG. 6 is a graph relating to the embodiment of the invention depicted in FIG. 1 illustrating (i) the relatively high voltage signal generated by the voltage amplifying means, and (ii) the output of the pulse density modulated switching power supply, with the output of the pulse density modulated switching power supply being shown after passage through the pulse filters.

Referring now to FIGS. 5 and 6, the output voltage $V_{CC}$ of pulse generating means 400 is shown. More particularly, so long as the instantaneous amplitude of the relatively high voltage signal remains sufficiently far below the instantaneous level of the voltage of the input powering current amplifying means 300 (i.e., $V_{CC}$) to keep the current amplifying means out of saturation, no pulse will be fired by pulse generating means 400 and $V_{CC}$ will remain equal to $V_{DC2}$ (as indicated generally at 1300 in FIG. 5). However, when the instantaneous amplitude of the relatively high voltage signal rises high enough relative to the instantaneous level of the voltage of the input powering current amplifying means 300 to cause the current amplifying means to approach saturation (as indicated generally at 1305), at least one pulse of amplitude $V_{DC1}$ and 1 microsecond duration is fired by pulse generating means 400. This pulse has the effect of keeping current gain transistors 305 out of saturation and providing the higher current level required at that instantaneous signal voltage amplitude to properly drive the load. It is to be appreciated that at higher signal amplitude voltages, the density of pulses generated by pulse generating means 400 will be relatively high (as indicated generally at 1310 in FIG. 5). As the signal voltage drops off, the density of pulses will decrease.

The reason for this is that the slope of the applied voltage signal curve is at its smallest adjacent to its maximum value. Therefore, the voltage of an applied pulse has a shorter dissipation time prior to the difference between the instantaneous voltage value of the relatively high voltage signal applied to the current amplifying means and the instantaneous voltage level powering the current amplifying means exceeding the above-described predetermined value than during portions of the applied relatively high voltage signal curve characterized by larger instantaneous slope values.

Looking again at FIG. 3, pulse filters 900 comprise an inductor 905, a resistor 910 and a capacitor 915. Pulse filters 900 have an appropriately-selected time constant for adjusting the pulse profile received at the collectors of current gain transistors 305. More particularly, because the density of pulses is signal dependent as just explained, the generated pulses—after being filtered by pulse filters 900—will be shaped as a signal-approximated power waveform (as shown generally at 1311 in FIG. 6) thereby lowering the signal distortion at the amplifier output.

Figure 7:
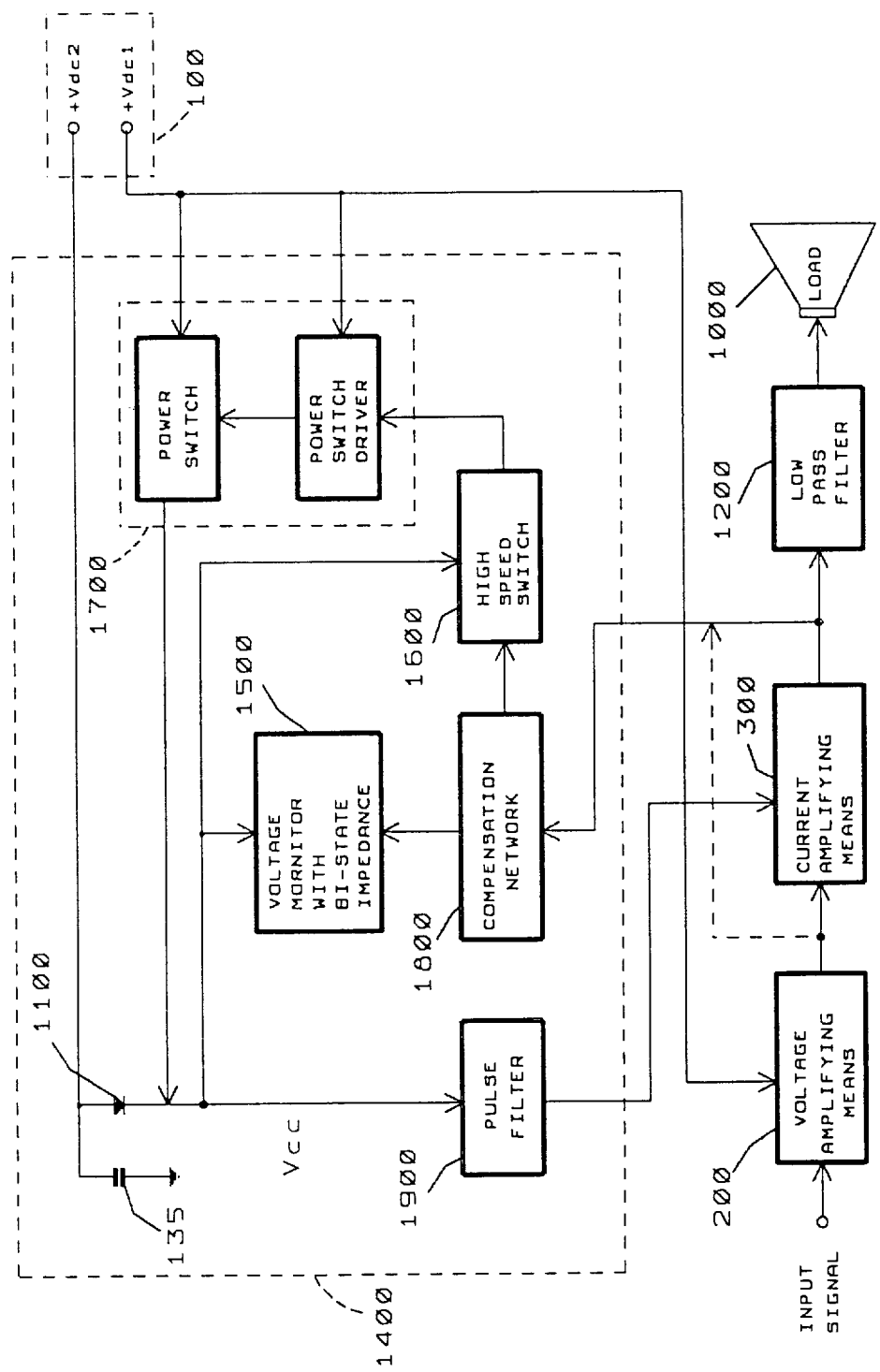
FIG. 7 is a block diagram of an alternative embodiment of a linear power amplifier with pulse density modulated switching power supply formed in accordance with the invention.
Figure 8:
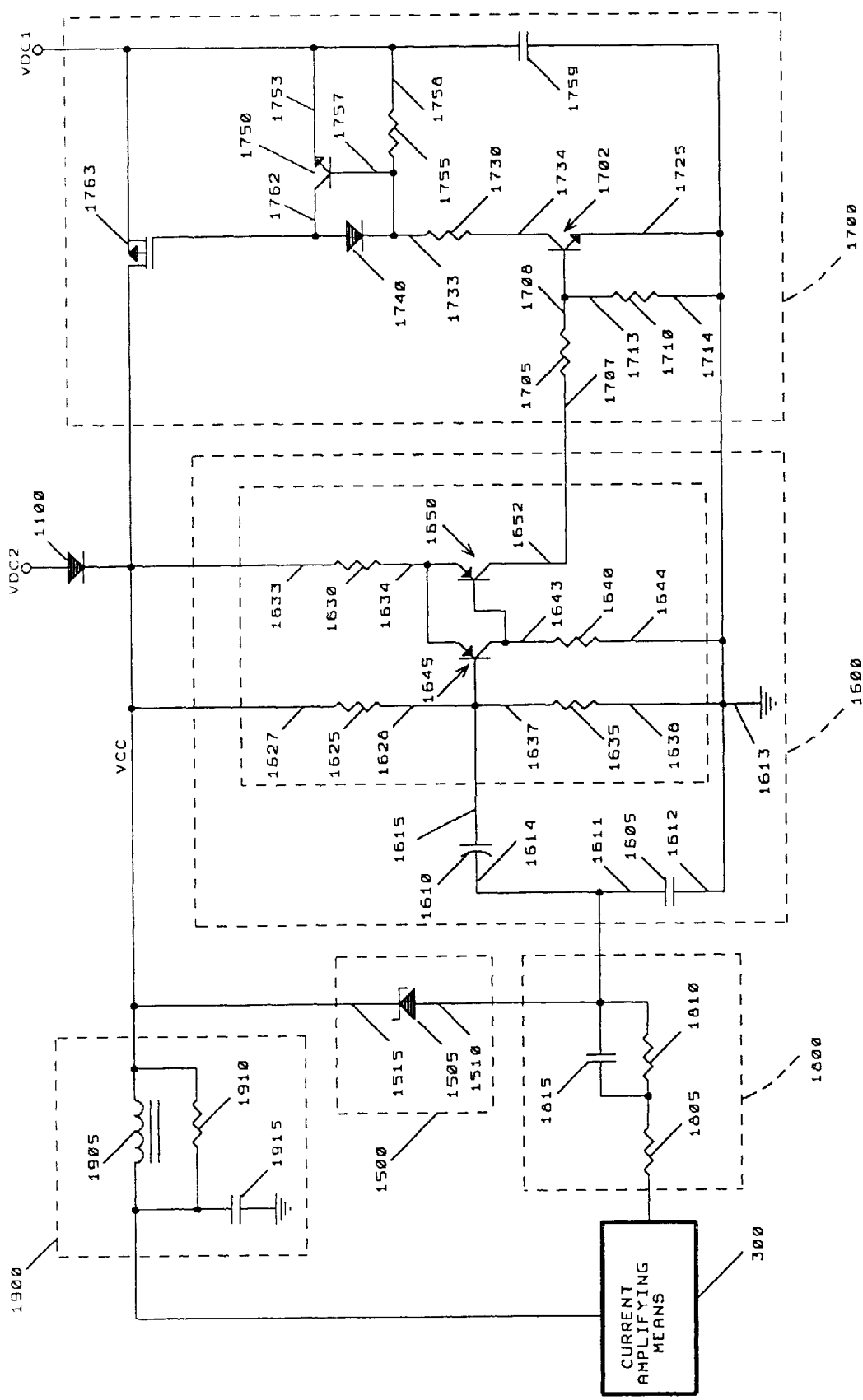
FIG. 8 is a schematic diagram illustrating the current amplifying means, the voltage monitor with bi-state impedance, the high speed switch, the power switch, the compensation network and the pulse filter of the alternative embodiment of the invention depicted in FIG. 7.

Looking next at FIGS. 7 and 8, an alternative embodiment of the present invention generally comprises power supply means 100, voltage amplifying means 200, current amplifying means 300 and pulse generating means 1400. Power supply means 100, voltage amplifying means 200 and current amplifying means 300 are identical to power supply means 100, voltage amplifying means 200 and current amplifying means 300 previously disclosed in detail above in connection with the embodiment of the invention depicted in FIGS. 1–6.

Pulse generating means 1400 generally comprise a voltage monitor with bi-state impedance 1500, a high speed switch 1600, a power switch 1700, a compensation network 1800 and a pulse filter 1900. Compensation network 1800 and pulse filter 1900 are identical to compensation network 800 and pulse filter 900 previously discussed in detail and depicted in FIGS. 1–6.

Still referring to FIG. 7, voltage monitor with bi-state impedance 1500 compares the instantaneous voltage amplitude of the output signal of current amplifying means 300 (or voltage amplifying means 200) with the instantaneous level of the voltage powering current amplifying means 300, i.e., $V_{CC}$. More particularly, voltage monitor with bi-state impedance 1500 is adapted to be in one of two distinct states. A first state, characterized by very low impedance, occurs when the relatively high voltage signal remains sufficiently far below the voltage of the input powering current amplifying means 300 to keep the current amplifying means out of saturation. A second state, characterized by very high impedance, occurs when the relatively high voltage signal rises high enough relative to the voltage of the input powering current amplifying means 300 to cause the current amplifying means to approach saturation. In this respect it will be understood that the particular choice of components making up the linear power amplifier with pulse density modulated switching power supply will determine an exact point at which the voltage monitor with bi-state impedance 1500 switches between its high and its low impedance states (or vice versa).

High speed switch 1600 also is adapted to be in one of two states. More particularly, high speed switch 1600 comprises a first state corresponding to a switch "off" position which is maintained while voltage monitor with bi-state impedance 1500 is in its low impedance state. High speed switch 1600 further comprises a second state corresponding to a switch "on" position which is maintained while voltage monitor with bi-state impedance 1500 is in its high impedance state.

Power switch 1700 is also capable of being in one of two states. More particularly, power switch 1700 comprises a first state corresponding to a switch "off" position which is maintained while high speed switch 1600 is in its switch "off" state. When power switch 1700 is in its switch "off" state, $V_{DC1}$ is obstructed, and $V_{CC}$ is powered by $V_{DC2}$. Power switch 1700 also comprises a second state corresponding to a switch "on" position which is maintained while high speed switch 1600 is in its switch "on" position. Consequently, when power switch 1700 is in its switch "on" state, $V_{DC1}$ is not obstructed, and $V_{CC}$ will rise rapidly to $V_{DC1}$. In this state of the circuitry, high speed diode 1100 (FIGS. 7 and 8) receives a reverse bias, thereby effectively blocking $V_{DC2}$.

Compensation network 1800 is disposed between voltage amplifying means 200, and (i) voltage monitor with bi-state impedance 1500 and (ii) high speed switch 1600. Preferably, compensation network 1800 is disposed between current amplifying means 300, and (i) voltage monitor with bi-state impedance 1500 and (ii) high speed switch 1600, respectively. Compensation network 1800 comprises appropriately chosen resistor and capacitor components which provide a bias to voltage monitor with bi-state impedance 1500 and set the operating point of high speed switch 1600. Furthermore, compensation network 1800 corrects for unwanted phase shifts in pulse generating means 1400.

Pulse filter 1900 is used to condition the waveform of the high voltage pulses generated by pulse generating means 1400 prior to their application to current amplifying means 300.

The foregoing alternative embodiment of the present invention (i.e., the embodiment of FIGS. 7 and 8) operates as follows. A relatively low voltage signal is received by voltage amplifying means 200. Voltage amplifying means 200 amplify this relatively low voltage signal into a relatively high voltage signal. Voltage amplifying means 200 are powered directly by $V_{DC1}$, and provide all of the voltage gain applied to the low voltage signal prior to it use in driving load 1000. Specifically, the output of voltage amplifying means 200 is applied to current amplifying means 300 so as to power load 1000, via low pass filter 1200.

Pulse generating means 1400 continuously compare the instantaneous voltage amplitude of the output signal of current amplifying means 300 (or voltage amplifying means 200) with the instantaneous level of the voltage powering current amplifying means 300. More particularly, the instantaneous voltage amplitude of the output signal of current amplifying means 300 (or voltage amplifying means 200) is continuously compared with the instantaneous level of the voltage powering current amplifying means 300 (i.e., $V_{CC}$) via voltage monitor with bi-state impedance 1500. So long as the difference between the latter two voltage levels is greater than or equal to some predetermined value (i.e., a value sufficient to ensure that current amplifying means 300 are not approaching saturation) voltage monitor with bi-state impedance 1500 will remain in its low impedance state. Therefore, high speed switch 1600 will remain in its switch "off" state, and power switch 1700 will remain in its switch "off" state. Accordingly, $V_{CC}$ will remain at $V_{DC2}$, and current amplifying means 300 will be powered by the lower voltage $V_{DC2}$ which is set at a level sufficient to keep current amplifying means 300 out of saturation in such situations.

If, however, the instantaneous voltage amplitude of the output signal of current amplifying means 300 (or low voltage amplifying means 200) rises high enough relative to the instantaneous level of the voltage of the input powering current amplifying means 300 to cause the current amplifying means to approach saturation, voltage monitor with bi-state impedance 1500 changes states. In particular, voltage monitor with bi-state impedance 1500 switches from its low impedance state to its very high impedance state. This change in state induces a change in state in high speed switch 1600, from its switch "off" state to its switch "on" state. The change in state of high speed switch 1600, from "off" to "on", causes power switch 1700 to change state, from "off" to "on". Hence, $V_{CC}$ rises instantaneously from $V_{DC2}$ to the higher voltage level $V_{DC1}$. Current amplifying means 300 is consequently powered by the higher voltage $V_{DC1}$, so as to keep current amplifying means 300 out of saturation.

As soon as $V_{CC}$ rises to $V_{DC1}$, however, the aforementioned difference between the instantaneous voltage value at the output of the voltage amplifying means 200 and the instantaneous level of the voltage powering the current amplifying means 300 once again exceeds the aforementioned predetermined value tested for by voltage monitor with bi-state impedance 1500. Therefore, voltage monitor with bi-state impedance 1500 immediately switches back from its high impedance state to its very low impedance state. Further, high speed switch 1600 immediately switches from its switch "on" state to its switch "off" state, and causes power switch 1700 to also immediately switch from its switch "on" state to its switch "off" state. Thus, $V_{CC}$ is allowed to settle back toward $V_{DC2}$. In essence, therefore, as soon as the circuit turns itself "on" so as to raise $V_{CC}$ to $V_{DC1}$, the circuit starts to turn itself "off" so as to restore $V_{CC}$ toward $V_{DC2}$. Accordingly, it will be understood that a power pulse of very short duration and fixed amplitude $V_{DC1}$ is created whenever the instantaneous voltage amplitude of the relatively high voltage signal rises high enough vis-à-vis the instantaneous level of the voltage powering the current amplifying means to cause the current amplifying means to approach saturation.

The system immediately and continuously repeats the foregoing process over and over again to determine if and when another power pulse should be fired.

By choosing appropriate circuit components, it has been found that it is possible to fire in excess of 1 million pulses per second.

Thus, it will be seen that current amplifying means 300 normally will be powered by the lower voltage $V_{DC2}$ which is selected so as to keep current amplifying means 300 out of saturation most of the time. On the other hand, pulses of very short duration and fixed amplitude $V_{DC1}$ will be applied to the powering input of current amplifying means 300 whenever, and as long as, the difference between the instantaneous voltage amplitude of the output signal from current amplifying means 300 (or voltage amplifying means 200) and the instantaneous level of the voltage at the input powering current amplifying means 300 rises above the aforementioned predetermined value, i.e., whenever current amplifying means 300 would approach saturation while being powered at the lower voltage $V_{DC2}$ alone. In other words, pulse generating means 1400 will generate power pulses whenever, and so long as, the difference between the instantaneous voltage amplitude of the relatively high voltage signal and $V_{CC}$ drops to the point at which current amplifying means 300 approach saturation. In this way, the instantaneous current requirements demanded by load 1000 are met on an extremely efficient basis.

Significantly, the density of high voltage pulses issued to current amplifying means 300 by pulse generating means 1400 is directly proportional to the instantaneous voltage amplitude of the signal being applied to current amplifying means 300, and hence in accordance with the power requirements of the load.

Further details of this alternative embodiment of the linear power amplifier with pulse density modulated switching power supply are shown in FIGS. 7 and 8.

More particularly, pulse generating means 1400 generally comprise voltage monitor with bi-state impedance 1500, high speed switch 1600, power switch 1700, compensation network 1800 and pulse filter 1900.

Voltage monitor with bi-state impedance 1500 comprises a zener diode 1505 having an anode 1510 and a cathode 1515. Cathode 1515 is electrically connected to $V_{CC}$. Anode 1510 of zener diode 1505 is electrically connected to both high speed switch 1600 and compensation network 1800, as will hereinafter be disclosed in further detail.

Compensation network 1800 comprises two resistors 1805 and 1810, and a capacitor 1815. These elements are arranged so as to place capacitor 1815 in parallel electrical relationship with resistor 1810. One end of the parallel circuit of capacitor 1815 and resistor 1810 is connected to resistor 1805. The other end of the parallel circuit of capacitor 1815 and resistor 1810 is connected to anode 1510 of zener diode 1505. Resistor 1805 also is connected to the output of current amplifying means 300. As in the embodiment shown in FIGS. 1–6 described above, the values of capacitor 1815 and resistors 1805 and 1810 in compensation network 1800 are preferably chosen so as to be compatible with an audio frequency bandwidth of between about 20 hz to about 20 Khz. Of course, other applications of the present invention could dictate other values for these components without departure from the invention in its broadest aspects.

Anode 1510 of zener diode 1505 is further electrically connected to capacitors 1605 and 1610 of high speed switch 1600. Capacitor 1605 comprises leads 1611 and 1612. Capacitor 1605 is electrically connected to anode 1510 of zener diode 1505 via lead 1611, and to circuit ground potential 1613 via lead 1612. Capacitor 1610 comprises leads 1614 and 1615. Capacitor 1610 is electrically connected between anode 1510 of zener diode 1505 and the input of a Schmitt trigger 1620. More particularly, capacitor 1610 is electrically connected to anode 1510 of zener diode 1505 via lead 1614, and to the input of Schmitt trigger 1620 via lead 1615.

Schmitt trigger 1620 comprises resistors 1625, 1630, 1635 and 1640, and two transistors 1645 and 1650. Schmitt trigger 1620 is connected as follows. Resistor 1625 includes leads 1627 and 1628. Lead 1627 is electrically connected to $V_{CC}$ and lead 1628 is electrically connected to the base of transistor 1645. Resistor 1630 comprises leads 1633 and 1634. Lead 1633 is electrically connected to $V_{CC}$ and lead 1634 is connected to the emitters of transistors 1645 and 1650. Resistor 1635 comprises leads 1637 and 1638. Lead 1637 is electrically connected to the base of transistor 1645 and lead 1638 is connected to circuit ground potential 1613. Resistor 1640 comprises leads 1643 and 1644. Lead 1643 is connected to the collector of transistor 1645 and to the base of transistor 1650. Lead 1644 is connected to circuit ground potential 1613. Additionally, the base of transistor 1645 is connected to lead 1615 of capacitor 1610.

Collector output lead 1652 of transistor 1650 is electrically connected to the base of a transistor 1702 of power switch 1700 via a resistor 1705. More particularly, resistor 1705 includes leads 1707 and 1708. A resistor 1710 comprises leads 1713 and 1714. Collector lead 1652 of transistor 1650 is electrically connected to lead 1707 of resistor 1705. Lead 1708 of resistor 1705 is electrically connected to lead 1713 of resistor 1710, and to the base of transistor 1702. Lead 1714 of resistor 1710 is electrically connected to circuit ground potential 1613.

The emitter of transistor 1702 (indicated at 1725) is electrically connected to circuit ground potential 1613. A resistor 1730 comprises leads 1733 and 1734. Lead 1734 is electrically connected to the collector of transistor 1702, and lead 1733 of resistor 1730 is connected to the cathode of a diode 1740. Lead 1733 of resistor 1730 and the cathode of diode 1740 also are electrically connected to the base of a transistor 1750.

A resistor 1755 comprises two leads 1757 and 1758. Lead 1757 is connected to the base of transistor 1750, to lead 1733 of resistor 1730, and to the cathode of diode 1740. Lead 1758 of resistor 1755 is connected to $V_{DC1}$ at a point between $V_{DC1}$ and a capacitor 1759. Capacitor 1759 is placed between lead 1758, $V_{DC1}$ and circuit ground potential 1613. Collector lead 1753 of transistor 1750 is electrically connected to $V_{DC1}$. The emitter lead 1762 of transistor 1750 is electrically connected to the anode of diode 1740 and to the gate of power MOSFET 1763. Power MOSFET 1763 has its source electrically connected to $V_{DC1}$ and its drain electrically connected to the $V_{CC}$ line.

Pulse generating means 1400 operate as follows.

Voltage monitor with bi-state impedance 1500, comprises zener diode 1505 which has its anode 1510 electrically connected to the output of current amplifying means 300 (or voltage amplifying means 200) via compensation network 1800, and to the input of high speed switch 1600 via lead 1614 of capacitor 1610 (see, FIG. 8). The cathode 1515 of zener diode 1505 is electrically connected to $V_{CC}$ at the output of power switch 1700.

Zener diode 1505 has a low impedance when the voltage potential difference applied across its leads is above its breakdown voltage value (hereinafter referred to as $V_Z$). Zener diode 1505 has a high impedance when the voltage potential difference applied across its leads is below that same breakdown voltage value $V_Z$. Breakdown voltage $V_Z$ is selected such that (i) the Zener diode will have low impedance (i.e., it will behave like a "closed" switch) when the instantaneous value of the relatively high voltage signal remains sufficiently far below the instantaneous level of the voltage of the input powering current amplifying means 300 that the current amplifying means does not approach saturation, and (ii) the Zener diode will have high impedance (i.e., it will act like an "open" switch) when the instantaneous value of the relatively high voltage signal rises high enough relative to the instantaneous level of the voltage of the input powering current amplifying means 300 to cause the current amplifying means to approach saturation.

For the circuit shown in FIGS. 7 and 8, a preferred value of the breakdown voltage for zener diode 1505 is approximately 4.7 volts. It will be understood by those skilled in the art, however, that this choice of breakdown voltage may vary according to the parametric requirements of the various other components in the circuit.

Turning next to high speed switch 1600, transistors 1645 and 1650, in combination with resistors 1625, 1630, 1635 and 1640, form a conventional Schmitt trigger circuit. The bias point at the base of transistor 1645 is set by resistor 1625 (located between $V_{CC}$ and the base of transistor 1645 in FIG. 8), and by resistor 1635 (located between the base of transistor 1645 and circuit ground potential 1613). The bias point at the base of transistor 1650 is set by resistors 1630 and 1640. Capacitor 1610 does not set the bias point of transistors 1645 and 1650. Instead, capacitor 1610 is used to block the DC content of the output of voltage monitor with bi-state impedance 1500 so as to an adverse affect upon the operating point of Schmitt trigger 1620.

In pulse generating means 1400, transistor 1645 is in saturation (i.e., "on") when the instantaneous output voltage of current amplifying means 300 (or voltage amplifying means 200) is sufficiently far below the instantaneous level of the voltage of the input powering current amplifying means 300 to prevent the current amplifying means from approaching saturation. Transistor 1645 is not in saturation (i.e., it is "off") when the instantaneous output voltage of current amplifying means 300 (or voltage amplifying means 200) rises high enough relative to the instantaneous level of the voltage of the input powering current amplifying means 300 to cause current amplifying means 300 to approach saturation. Furthermore, transistor 1650 is "off" when transistor 1645 is "on", and transistor 1650 is "on" when transistor 1645 is "off".

Capacitor 1605 serves as a speeding capacitor. The value of capacitor 1605 is selected so that it acts like a short circuit to ground in response to a power pulse passing through the $V_{CC}$ line. The "speeding" effect of capacitor 1605, in response to $V_{CC}$ increasing to $V_{DC1}$, instantaneously creates a large voltage drop across zener diode 1505. This large voltage drop, coupled through capacitor 1610 to the base of transistor 1645, effectively saturates transistor 1645 instantaneously upon the issuance of a power pulse through the $V_{CC}$ line. In effect, at the very moment that the pulse generating means 1400 generates an output power pulse to current amplifying means 300 on the $V_{CC}$ line, the circuit starts to turn itself "off". Compensation network 1800 aids in this process by establishing the voltage value at lead 1614 of capacitor 1610.

Turning next to power switch 1700, resistors 1705 and 1710 bias the base of transistor 1702. When transistor 1650 is switched "on" by a change in the bias of the base of transistor 1645, transistor 1702 is also turned "on". The collector of transistor 1702 is coupled to the base of transistor 1750 via resistor 1730. When transistor 1702 turns "on", diode 1740 is biased into conduction, and transistor 1750 is turned "off". Accordingly, when diode 1740 is in conduction, the gate voltage of MOSFET 1763 falls. This gives MOSFET 1763 a forward bias, thereby turning it "on" and raising $V_{CC}$ to $V_{DC1}$. During circuit reset, transistor 1750 removes the gate storage charge of the power MOSFET 1763 so as to allow its fast recovery.

As soon as $V_{CC}$ rises to $V_{DC1}$, the voltage present at the cathode of zener diode 1505 once again is high enough relative to the instantaneous amplitude of the relatively high voltage signal present at the anode of zener diode 1505 to return zener diode 1505 to its low impedance state. Also, the voltage difference between $V_{CC}$ and the base of transistor 1645 (i.e., across resistor 1625) increases, thereby turning transistor 1645 "on" and turning transistor 1650 "off". This causes transistor 1702 to switch "off", transistor 1750 to switch "on", and MOSFET 1763 to switch "off". Accordingly, $V_{CC}$ settles toward $V_{DC2}$. In effect, at the very moment that pulse generating means 1400 boosts $V_{CC}$ so as to keep current amplifying means 300 out of saturation, the circuit starts to turn itself "off".

Thus it will be seen that so long as the instantaneous voltage output of the current amplifying means 300 remains sufficiently far below the instantaneous level of the voltage at the input powering current amplifying means 300 to keep the current amplifying means out of saturation, transistor 1645 will be "on", transistor 1650 will be "off", transistor 1702 will be "off", transistor 1750 will be "on", and MOSFET 1763 will be "off". In other words, so long as the instantaneous amplitude of the relatively high voltage signal remains sufficiently far below the instantaneous level of the voltage at the input powering current amplifying means 300 to keep the current amplifying means out of saturation, no pulse will be fired. However, when the instantaneous voltage output of current amplifying means 300 rises high enough relative to the instantaneous level of the voltage powering current amplifying means 300 to cause the current amplifying means to approach saturation, transistor 1645 will turn "off", transistor 1650 will turn "on", transistor 1702 will turn "on", transistor 1750 will turn "off", and MOSFET 1763 will turn "on". In other words, as soon as the instantaneous amplitude of the relatively high voltage signal rises high enough relative to the instantaneous level of the voltage powering current amplifying means 300 to cause the current amplifying means to approach saturation, $V_{CC}$ will rise to $V_{DC1}$. Of course, as soon as $V_{CC}$ rises to $V_{DC1}$, transistor 1645 will turn "on" again, transistor 1650 will turn "off" again, transistor 1702 will turn "off" again, transistor 1750 will turn "on" again, and MOSFET 1763 will turn "off" again, thus causing $V_{CC}$ to settle back towards $V_{DC2}$.

The foregoing process repeats itself over and over again, to determine if and when another power pulse should be fired.

Thus, with each cycle of zener diode 1505, Schmitt trigger 1620 and power switch 1700, a power pulse of approximately 1 microsecond duration, and having an amplitude corresponding to $V_{DC1}$, is created. The frequency of the generated pulses is directly related to: (i) the instantaneous amplitude of the relatively high voltage signal provided by current amplifying means 300 (or voltage amplifying means 200), and (ii) the instantaneous level of the voltage at the input powering the current amplifying means. In particular, each time the instantaneous voltage amplitude of the relatively high voltage signal rises to a level that will cause current gain transistors 305 to approach their saturation point, pulse circuit 1400 fires and $V_{CC}$ is very quickly raised to the higher $V_{DC1}$ voltage level. However, as soon as $V_{CC}$ reaches $V_{DC1}$, the potential difference across zener diode 1505 increases (due in large part to the action of capacitor 1605), causing zener diode 1505 to immediately return to its low impedance state. This changes the state of Schmitt trigger 1620 and turns off power switch 1700, whereby $V_{CC}$ is allowed to settle toward $V_{DC2}$. Thus, a 1 microsecond wide pulse of amplitude $V_{DC1}$ is created.

Referring again to FIGS. 5 and 6, the output voltage $V_{CC}$ of pulse generating means 1400 is shown. More particularly, so long as the instantaneous amplitude of the relatively high voltage signal remains sufficiently far below the instantaneous level of the voltage at the input powering current amplifying means 300 (i.e., $V_{CC}$) to keep the current amplifying means out of saturation, no pulse will be fired by pulse generating circuit 1400 and $V_{CC}$ will remain equal to $V_{DC1}$ (as indicated generally at 1300 in FIG. 5). However, when the instantaneous amplitude of the relatively high voltage signal rises high enough relative to the instantaneous level of the voltage at the input powering current amplifying means 300 to cause the current amplifying means to approach saturation (as indicated generally at 1305), at least one pulse of amplitude $V_{DC1}$ and duration 1 microsecond is fired by pulse generating means 1400. This pulse drives current gain transistors 305 out of saturation and provides the higher current level required at that instantaneous signal voltage amplitude to properly drive the load. In this respect it should be appreciated that at higher signal amplitude voltages, a greater density of pulses will be generated by pulse generating means 1400 (as indicated generally at 1310 in FIG. 5), and that as the instantaneous signal voltage drops off, the density of pulses will similarly decrease as discussed more fully hereinabove.

Similarly, FIG. 6 shows how pulse filters 1900 condition each pulse's profile so as to yield a signal-approximated power waveform. Pulse filters 1900 comprise an inductor 1905, a resistor 1910 and a capacitor 1915. Pulse filters 1900 have an appropriately-selected time constant for adjusting the pulse profile received at the collectors of current gain transistors 305. More particularly, because the density of pulses is signal dependent, these pulses—after being filtered by pulse filters 1900—will be shaped into a signal-approximated power waveform (as shown generally at 1311 in FIG. 6) for lowering the signal distortion at the amplifier output.

Figure 10:
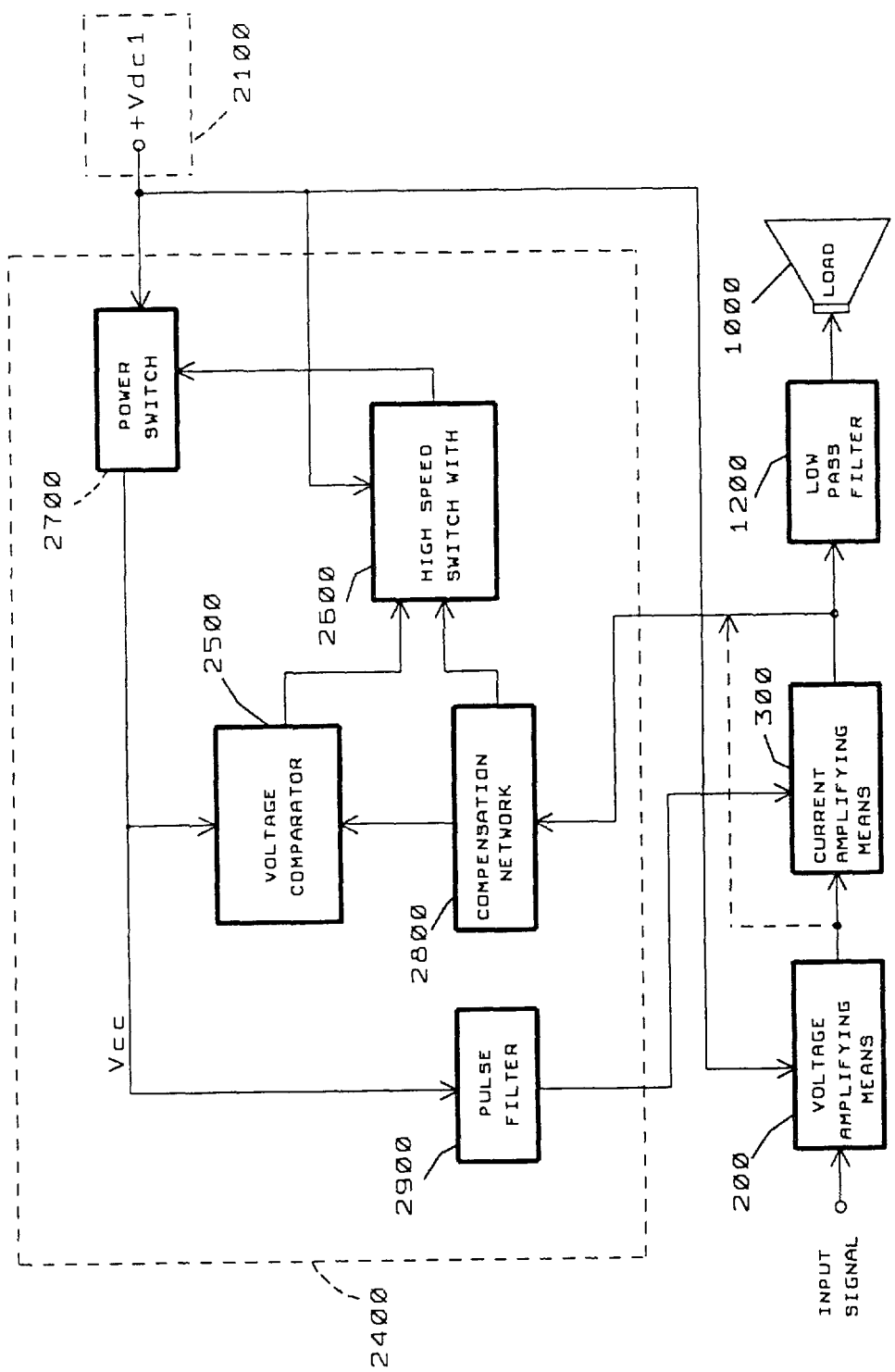
FIG. 10 is a block diagram of another alternative embodiment of the invention wherein the current amplifying means are powered only by the pulse generating means.

Referring next to FIG. 10, another alternative embodiment of the present invention is shown which comprises power supply means 2100, voltage amplifying means 200, current amplifying means 300 and pulse generating means 2400.

Pulse generating means 2400 generally comprise a voltage monitor 2500, a high speed switch 2600, a power switch 2700, a compensation network 2800 and a pulse filter 2900.

Power supply means 2100 comprise a dual polarity power source (see, for example, FIG. 11) which provides two output voltages, i.e., the (+) and (−) of a relatively high DC voltage (hereinafter referred to as $V_{DC1}$). $V_{DC1}$ is the supply voltage that powers voltage amplifying means 200 so as to provide high voltage swing to drive current amplifying means 300, as has been discussed in detail above. $V_{DC1}$ also intermittently powers current amplifying means 300 via pulse generating means 2400 by supplying power pulses to the power input of current amplifying means 300.

More particularly, $V_{CC}$ is the voltage that powers current amplifying means 300. In the absence of a relatively high voltage signal at the output of the voltage amplifying means 200, the average level of $V_{CC}$ during low signal levels (such that the current amplifying means are not in danger of approaching saturation) or no signal period, is maintained equal to a predetermined relatively low average DC voltage (such as $V_{DC2}$ in the first embodiment). This predetermined relatively low average DC voltage is referred to as $V_{DC2}$ hereinafter. In this regard, it should be noted that in this case (and throughout this specification) the term "average" is used to indicate that the instantaneous value of the voltage referred to may be higher or lower than that ideally desired. The speed with which the circuitry is cycled, however, minimizes the time periods during which the actual instantaneous voltage deviates from the desired voltage. Effectively, therefore, the so-called "average" voltages discussed herein may be considered to be essentially the desired voltages carrying a low level of noise induced by the cycling of the voltage above and below its desired value (level). Specifically, $V_{CC}$ is increased to $V_{DC1}$ by pulse generating means 2400 when the same is required either (i) to keep current amplifying means 300 out of saturation during the application of a relatively high DC voltage signal to the current amplifying means, or (ii) to maintain a desired average voltage level at the power input of the current amplifying means during periods of low signal level or periods of no signal.

$V_{DC1}$ is chosen so as to be high enough, relative to the maximum anticipated voltage amplitude of the relatively high voltage signal, to prevent current amplifying means 300 from ever reaching saturation when current amplifying means 300 are powered at $V_{DC1}$. Again, as noted above, the maximum anticipated voltage signal amplitude is normally determined by the maximum output power of an amplifier, as stated by a manufacturer for commercial purposes. At the same time, however, $V_{DC1}$ also is chosen so as to apply no more voltage to current amplifying means 300 than is absolutely necessary in order to fully power load 1000.

$V_{DC2}$ is chosen so as to be high enough to power current amplifying means 300 during periods of low signal level, or periods of no signal without current amplifying means approaching saturation. At the same time, however, for reducing the power dissipation of the current amplifying means, $V_{DC2}$ also is chosen so as to be low enough to apply as little voltage as possible to current amplifying means 300 when powering load 1000 during such low level, or no signal.

It will be understood by those skilled in the art that in the following circuits, the various components may be arranged so as to operate at (+) $V_{DC1}$ and (+) $V_{DC2}$, or to operate at (−) $V_{DC1}$ and (−) $V_{DC2}$, or both. For simplicity of description, this embodiment of the invention will be discussed in terms of single polarity, positive voltages. It should be understood, however, that the scope of the present invention extends to various circuits of the type described, operating on either positive or negative voltages, or both.

As in the previously discussed embodiments of the invention, voltage amplifying means 200 comprise a sensitive, high gain voltage amplification circuit which provides a low noise voltage amplification of signals such as audio-frequency signals received from an external source, e.g. from a microphone amplifier, a CD player, a computer sound card, etc. Similarly, current amplifying means 300 comprise current gain transistors or the like which are driven by the output of voltage amplifying means 200 so as to boost the current flow associated with the relatively high voltage signal received from voltage amplifying means 200, as needed, in order to properly drive load 1000.

Pulse generating means 2400 are connected to the power input of current amplifying means 300, and also to the ouput of current amplifying means 300 (or, if perferred, to the output of voltage amplifying means 200). In this embodiment of the invention, pulse generating means 2400 compare the instantaneous level of $V_{CC}$ powering current amplifying means 300 with (i) an internal reference standard under low signal level or no signal periods, and (ii) the instantaneous voltage of the relatively high voltage signal at the output of voltage amplifying means 200 (or current amplifying means 300) when the level of the relatively high level signal is high enough to cause danger of saturation of current amplifying means. Pulse generating means 2400 provide fixed duration pulses (at the relatively high DC level, $V_{DC1}$) (a) whenever the instantaneous voltage powering the current amplifying means 300 falls below a level set by the internal reference standard, or whenever, the instantaneous voltage amplitude of the relatively high voltage signal rises high enough vis-à-vis the instantaneous level of the voltage powering current amplifying means 300 to cause the current amplifying means to approach saturation.

Pulse generating means 2400 comprise a voltage monitor 2500. Voltage monitor 2500 has two independent input terminals and one output terminal. One of the input terminals is connected to the compensation network 2800, and the other input terminal is connected to $V_{CC}$ (the voltage powering the current amplifying means 300). The output terminal of voltage monitor 2500 is connected to an input of high speed switch 2600.

Voltage monitor 2500 has two distinct states, namely, an "on" state and an "off" state. In particular, voltage monitor 2500 normally remains in its "on" state. In this "on" state, voltage monitor 2500 connects $V_{CC}$ to an input of high speed switch 2600 for further processing. The "on" state of the voltage monitor 2500 is maintained so long as the instantaneous voltage amplitude of the relatively high voltage signal does not rise to a level which would cause the current amplifying means 300 to approach saturation. Whenever the instantaneous voltage amplitude of the relatively high voltage signal rises to a level sufficiently high to cause the current amplifying means to approach saturation, voltage monitor 2500 switches to its "off" state. This change in state of voltage monitor 2500 causes high speed switch 2600 to change its state so as to cause power switch 2700 to fire a high voltage pulse.

High speed switch 2600 also is adapted to cycle between two distinct states. More particularly, high speed switch 2600 has a first state corresponding to a switch "off" position. The switch "off" position is maintained so long as (i) the voltage monitor 2500 is in its "on" state, and (ii) the instantaneous level of $V_{cc}$ at the output of voltage monitor 2500 is relatively higher than a predetermined value ($V_{DC2}$) set by the reference voltage standard internal to high speed switch 2600.

High speed switch 2600 further has a second state corresponding to a switch "on" position. This switch "on" position is induced either (1) when the difference between the instantaneous voltage amplitude of the output of current amplifying means 300 (or voltage amplifying means 200) and the instantaneous level of the voltage powering current amplifying means 300 (i.e., $V_{CC}$) is such that saturation of the current amplifying means 300 is likely, or (2) when the instantaneous level of the voltage powering the current amplifying means 300 is less than the predetermined $V_{DC2}$ set by the internal voltage standard of the high speed switch 2600.

High speed switch 2600 actuates power switch 2700 when high speed switch 2600 changes from its switch "off" state to its switch "on" state. More particularly, power switch 2700 switches $V_{CC}$ rapidly from its instantaneous level to $V_{DC1}$ in response to a change in the state of high speed switch 2600 from its switch "off" state to its switch "on" state. To this end, power switch 2700 also is capable of being in one of two states. The first of these states corresponds to a switch "off" position. Power switch 2700 is maintained in its switch "off" state while high speed switch 2600 is in its switch "off" state. Power switch 2700 also has a switch "on" state which is assumed when high speed switch 2600 cycles to its corresponding switch "on" state. In its switch "on" state, power switch 2700 causes $V_{CC}$ to rise rapidly to $V_{DC1}$.

A compensation network 2800 is disposed (i) between voltage amplifying means 200 and high speed switch 2600, and (ii) between voltage amplifying means 200 and voltage monitor 2500. As discussed above in connection with the other embodiments of the invention, compensation network 2800 comprises appropriately chosen resistor and capacitor components for (i) correcting unwanted phase shifts induced by pulse generating means 2400, and (ii) conditioning one of the inputs to high speed switch 2600 (i.e., the relatively high voltage signal generated by voltage amplifying means 200) so that the high speed switch will fire at the proper moment.

Also as discussed previously, a pulse filter 2900 is used to condition the waveform of the high voltage pulse provided by pulse generating means 2400 prior to the application of that pulse to the power input of current amplifying means 300.

Still referring to FIG. 10, the embodiment of the linear power amplifier with pulse density modulated power supply therein shown operates as follows. A relatively low voltage signal is received from an external source by voltage amplifying means 200. Voltage amplifying means 200 amplify this relatively low voltage signal into a relatively high voltage signal. Voltage amplifying means 200 are powered by $V_{DC1}$, and provide all of the voltage gain applied to the low level signal prior to driving load 1000. The output of voltage amplifying means 200 is applied to current amplifying means 300 so as to power load 1000, via low pass filter 1200.

Pulse generating means 2400 (i) create and maintain a substantially constant average level of $V_{CC}$ at a relatively low DC voltage (say, $V_{DC2}$) to power current amplifying means 300 during periods of low signal level or periods of no signal, and (ii) continuously compare the instantaneous voltage amplitude of the output signal of current amplifying means 300 (or voltage amplifying means 200) with the instantaneous voltage level powering current amplifying means 300. More particularly, when the instantaneous voltage amplitude of the relatively high voltage signal from the voltage amplifying means 200 is not such as to cause the current amplifying means 300 to approach saturation, the voltage monitor 2500 remains in its "on" state wherein $V_{CC}$ is connected to the input of the high speed switch 2600. As long as the relative level of $V_{CC}$ at the input of the high speed switch 2600 is greater than the predetermined $V_{DC2}$, which is set by the internal voltage reference standard of the high speed switch 2600, the high speed switch 2600 remains in its "off" state.

However, when the relative level of $V_{CC}$ at the input of the high speed switch 2600 is lower than the predetermined $V_{DC2}$ set by the internal reference voltage standard of the high speed switch 2600, the high speed switch 2600 changes from its switch "off" state to its switch "on" state thereby triggering the power switch 2700 to fire a power pulse. This power pulse causes the voltage level of $V_{CC}$ to rise instantaneously to the relatively high DC voltage $V_{DC1}$. Thereafter, voltage monitor 2500 reverts to its "on" state, and the level of $V_{CC}$ rises to cause the voltage at the input of the high speed switch 2600 to go above the internal voltage reference standard of high speed switch 2600 during periods of low signal level or periods of no signal from the voltage amplifying means. When this occurs, the high speed switch 2600 immediately reverts to its "off" state. The resulting pulse train creates a substantially fixed average level of relatively low average DC voltage $V_{DC2}$ at $V_{cc}$ during the intervals between signals from the voltage amplifying means.

Also, the instantaneous voltage amplitude of the output signal of current amplifying means 300 (or voltage amplifying means 200) is continuously compared with the instantaneous level of voltage powering current amplifying means 300 (i.e., $V_{CC}$) via voltage monitor 2500. As long as the difference between these two voltage levels remains greater than or equal to some predetermined value (i.e., a value sufficient to ensure that current amplifying means 300 are not approaching saturation), the voltage monitor 2500 remains in its "on" state. Thus, current amplifying means 300 always will be powered at least by an average voltage $V_{DC2}$ determined by the internal voltage reference standard selected for use in the high speed switch 2700, assuming $V_{DC2}$ is selected so as to be sufficient to keep current amplifying means 300 out of saturation.

If, however, the instantaneous voltage amplitude of the output signal of current amplifying means 300 (or voltage amplifying means 200) rises high enough relative to the instantaneous level of the voltage of the input powering current amplifying means 300 to cause the current amplifying means to approach saturation, voltage monitor 2500 changes its state from switch "on" to switch "off". High speed switch 2600 immediately changes state, from its switch "off" state to its switch "on" state, and power switch 2700 changes state, from switch "off" to switch "on". This causes $V_{CC}$ to instantaneously rise from its average $V_{DC2}$ level to the higher voltage level $V_{DC1}$. As a result, current amplifying means 300 is powered by the higher voltage $V_{DC1}$ so as to keep current amplifying means 300 out of saturation.

In this case as well, however, as soon as $V_{CC}$ rises to $V_{DC1}$, the state of the elements of the pulse generation means 2400 which caused the triggering of a high voltage pulse are reversed. Specifically, since $V_{DC1}$ is selected to be substantially greater than the instantaneous level of the voltage of the output signal of the voltage amplifying means 200, the increase of $V_{CC}$ to $V_{DC1}$ increases the difference between $V_{CC}$ and the instantaneous voltage of the output of the voltage amplifying means 200 to a point whereat saturation of the current amplifying means 300 is unlikely. Hence, the increase of $V_{CC}$ to $V_{DC1}$ immediately switches an "off" state of the voltage monitor 2500 back to an "on" state thereof This, in turn, switches the previously "on" states of the high speed switch 2600 and the power switch 2700 back to the respective "off" states thereof In essence, therefore, as soon as the circuit turns itself "on" so as to raise $V_{CC}$ to $V_{DC1}$, the circuit starts to turn itself "off" so as to allow $V_{CC}$ to gradually return toward $V_{DC2}$. Thus, a power pulse of very short duration and fixed amplitude $V_{DC1}$ is created (i) whenever the instantaneous voltage amplitude of the relatively high voltage signal rises high enough vis-à-vis the instantaneous level of the voltage powering current amplifying means 300 to cause the current amplifying means to approach saturation, or (ii) whenever the instantaneous voltage powering the current amplifying means 300 drops below a predetermined value ($V_{DC2}$) set by the level of the internal reference voltage standard of the high speed switch 2600.

The system immediately and continuously repeats the foregoing process over and over again to determine if, and when, another power pulse should be fired. It will be understood, therefore, that at least during periods of low level signal or periods of no signal, current amplifying means 300 will be powered by a low average voltage $V_{CC}=V_{DC2}$ (for low power dissipation) so long as that low average voltage $V_{DC2}$ is sufficient to keep current amplifying means 300 out of saturation. Further, pulses of very short duration and fixed, higher voltage amplitude $V_{DC1}$ will be applied to current amplifying means 300 whenever, and as long as, the difference between the instantaneous voltage amplitude of the output signal from current amplifying means 300 (or voltage amplifying means 200) and the instantaneous level of voltage at the input powering current amplifying means 300 drops below the aforementioned predetermined value. In other words, pulse generating means 2400 will generate power pulses whenever, and so long as, the difference between the instantaneous voltage amplitude of the relatively high voltage signal and $V_{CC}$ drops to the point at which current amplifying means 300 will approach saturation. As discussed previously, the density of high voltage pulses issued to current amplifying means 300 by pulse generating means 2400 is directly proportional to the instantaneous voltage amplitude of the signal being applied to current amplifying means 300 in accordance with the power consumed by the load.

Power supply means 2100 comprise a transformer 2105 adapted for AC to DC conversion. Transformer 2105 is typically a 50/60 Hz power transformer having center tap windings of the sort well known in the art. Transformer 2105 provides $V_{DC1}$ (e.g., 24 volts DC) from a power main or other source of AC voltage. It will be understood that other relative voltage values may be used without departing from the scope of the invention in its broadest aspects.

Figure 11:
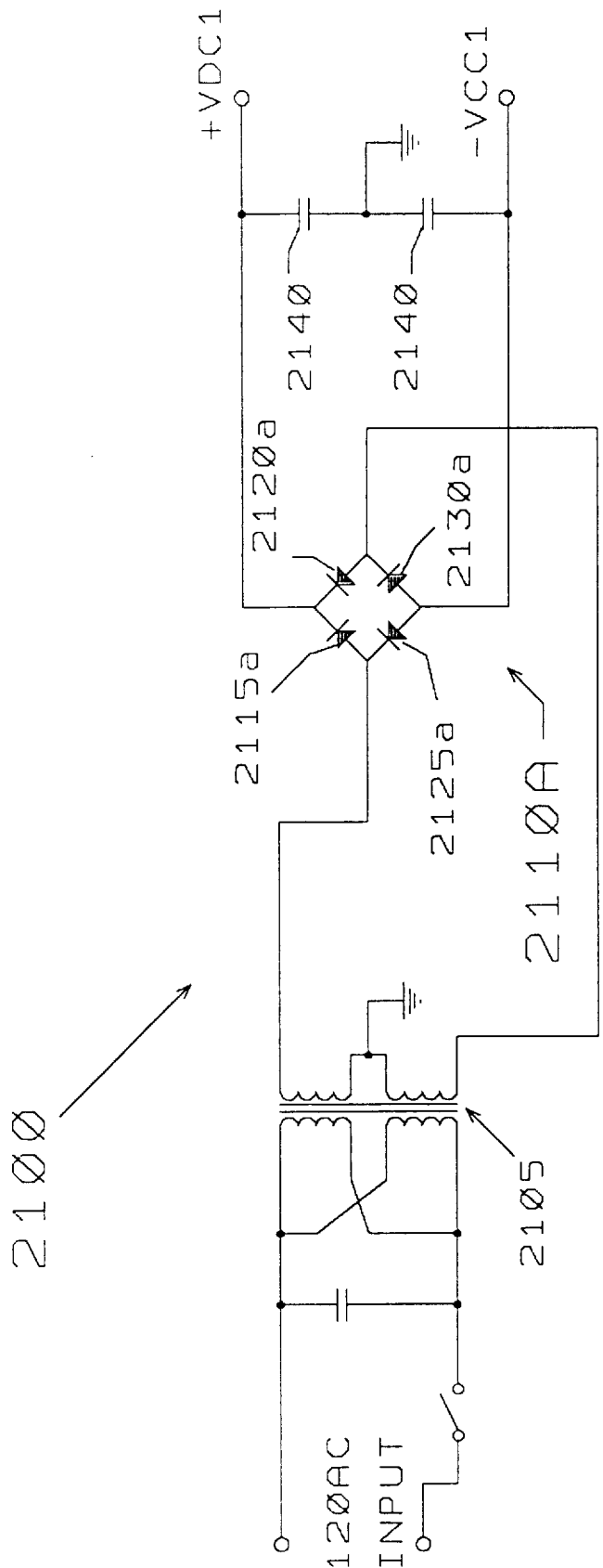
FIG. 11 is a schematic diagram illustrating a power supply means suitable for use with the embodiment of the invention depicted in FIG. 10.

A full wave bridge rectifier 2110a receives the output of transformer 2105. Full wave bridge rectifier 2110a comprise diodes 2115a, 2120a, 2125a and 2130a, respectively, as shown in FIG. 11. Capacitor 2140 provides filtering for $V_{DC1}$. Thus, power supply means 2100 provides two output voltages, at (+) and (−) $V_{DC1}$.

Figure 12:
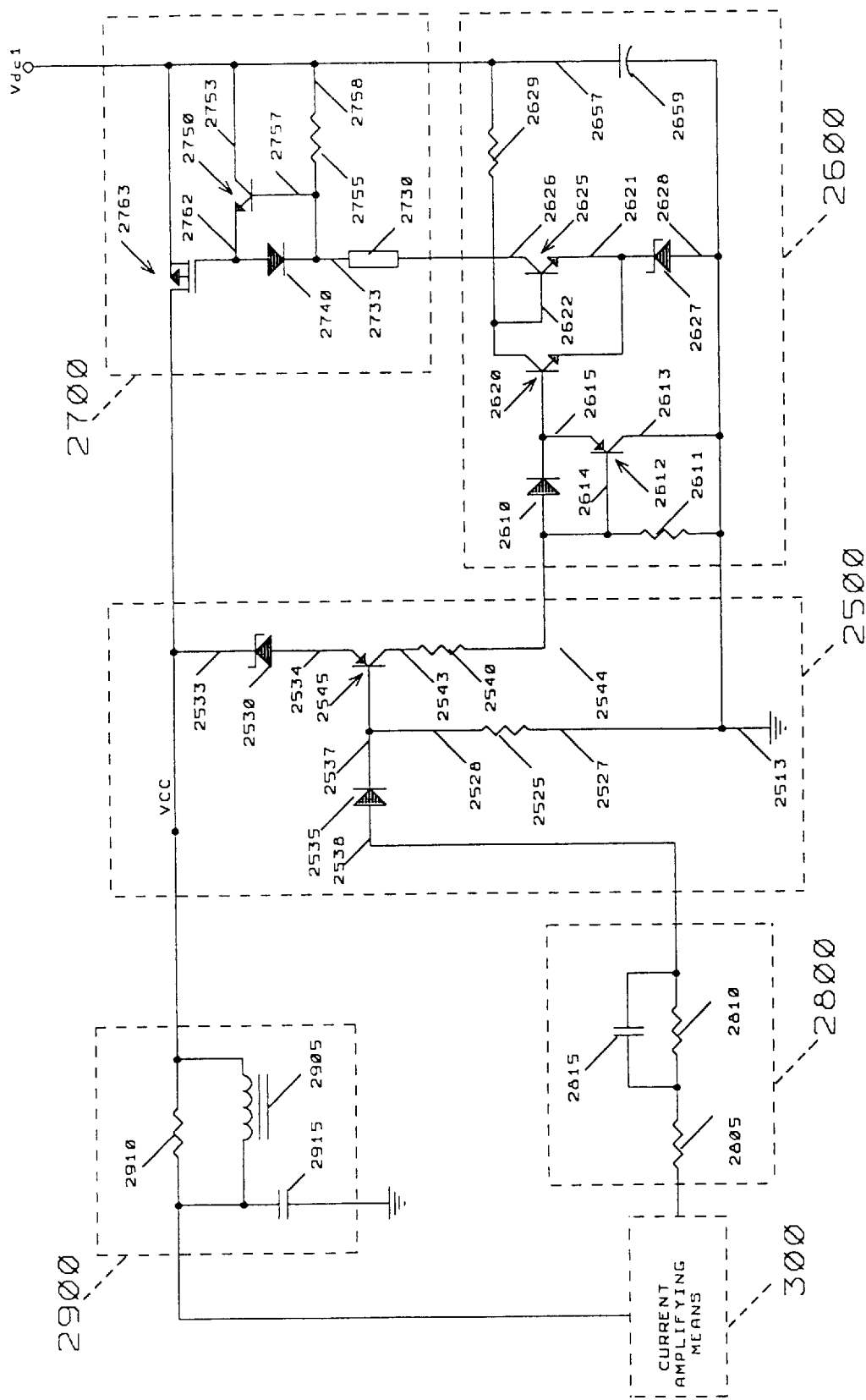
FIG. 12 is a schematic diagram illustrating the current amplifying means, the voltage monitor with bi-state impedance, the high speed switch with internal reference voltage standard, the power switch, the compensation network and the pulse filter of the alternative of the invention depicted in FIG. 10.
Figure 13:
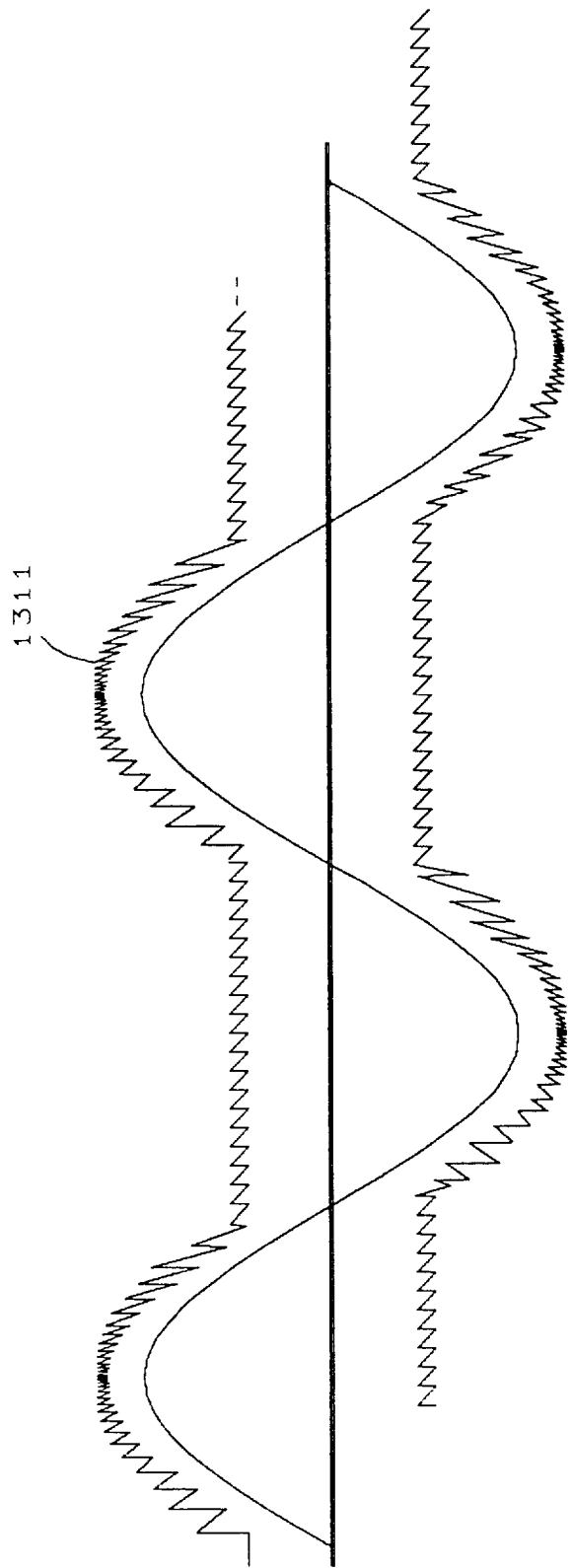
FIG. 13 is a graph similar to FIG. 6 illustrating (i) the relatively high voltage signal generated by the voltage amplifying means, and (ii) the output of the pulse density modulated switching linear power amplifier of the embodiment of the invention depicted in FIG. 10, wherein that output is shown after its passage through the pulse filters.
Figure 14:
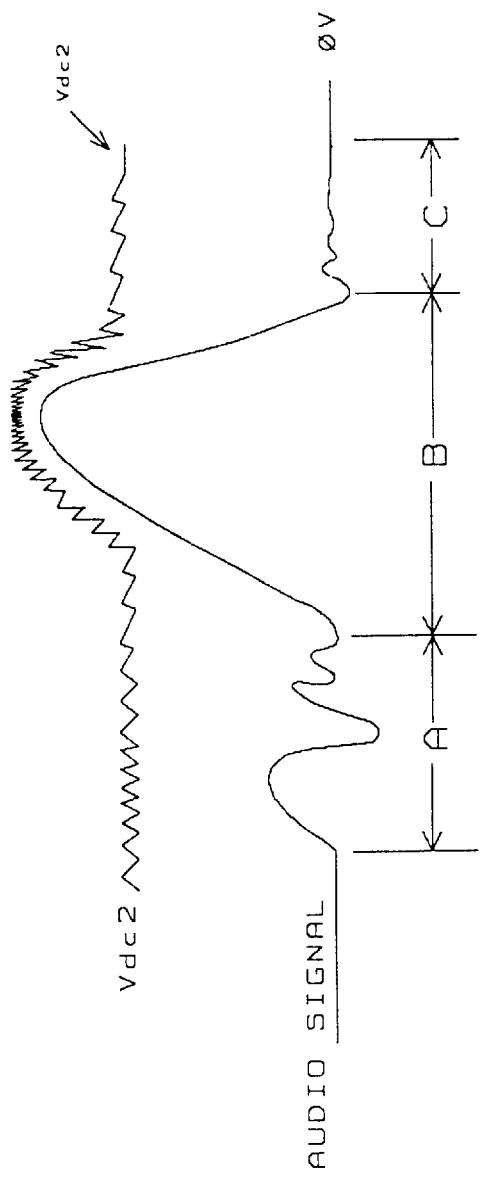
FIG. 14 is an illustrative graphical depiction of the operation of the invention.

Looking next at FIGS. 10 and 12 (and as alluded to above), pulse generating means 2400 generally comprise voltage monitor 2500, high speed switch 2600, power switch 2700, compensation network 2800 and pulse filter 2900.

Voltage monitor 2500 comprises a zener diode 2530, a transistor 2545, a diode 2535 and two resistors 2525 and 2540. Zener diode 2530 includes leads 2533 and 2534. Lead 2533 connects the cathode of zener diode 2530 to $V_{CC}$. Lead 2534, on the other hand, connects the anode of zener diode 2530 to the emitter of transistor 2545. Diode 2535 includes leads 2537 and 2538. Lead 2537 connects the cathode of diode 2535 to the base of transistor 2545, and lead 2538 connects the anode of diode 2535 to the compensation network 2800. Further, resistor 2525 includes leads 2527 and 2528. Lead 2527 is connected to $V_{DC1}$ via capacitor 2659 and also to circuit ground via lead 2513. Lead 2528, on the other hand, is connected to the cathode of diode 2535 and to the base of transistor 2545 via lead 2537. Still further, resistor 2540 includes leads 2543 and 2544. Lead 2543 connects resistor 2540 to the collector of transistor 2545. Lead 2544, on the other hand, connects resistor 2540 to the anode of diode 2610 of high speed switch 2600.

High speed switch 2600 comprises a zener diode 2627; a diode 2610; two resistors 2611 and 2629; three transistors 2612, 2620 and 2625; and a capacitor 2659. More particularly, the anode of diode 2610 is connected to circuit ground via resistor 2611 and to the base of transistor 2612 by lead 2614. The cathode of diode 2610 is connected to the emitter of transistor 2612 by lead 2615 and to the base of transistor 2620. The resistor 2611, the collector of transistor 2612 (via lead 2613) and the anode of zener diode 2627 (via lead 2628) are each connected to $V_{DC1}$ via capacitor 2659, circuit ground and resistor 2525 of voltage monitor 2500 by lead 2527. Capacitor 2659 is also connected between circuit ground and $V_{dc1}$. The cathode of zener diode 2627 is connected to the emitters of transistors 2620 and 2625 respectively by lead 2621. The collector of transistor 2620 and the base of transistor 2625 are connected to each other and to $V_{DC1}$ via resistor 2629. Finally, the collector of transistor 2625 is connected to element 2730 of power switch 2700.

Compensation network 2800 comprises two resistors 2805 and 2810, and a capacitor 2815. These elements are arranged so as to place capacitor 2815 in parallel electrical relationship with resistor 2810. One end of the parallel circuit of capacitor 2815 and resistor 2810 is connected to resistor 2805; the other end of the parallel circuit of capacitor 2815 and resistor 2810 is connected to lead 2538 of diode 2535. Resistor 2805 is also connected to the output of current amplifying means 300. In a preferred embodiment, the values of capacitor 2815 and resistors 2805 and 2810 are chosen so as to be compatible with an audio-frequency bandwidth of between about 20 Hz to about 20 Khz. Of course, other applications of the present invention could dictate other values for these components.

As alluded to above, lead 2626 connects the collector of transistor 2625 to power switch 2700. More particularly, in the embodiment of the present invention depicted in FIG. 12, element 2730 to which lead 2626 from high speed switch 2600 is connected is contemplated to be substantially identical in relevant function to elements 1702, 1765, 1708, 1710, 1713, 1714, 1725, 1730, 1733 and 1734 discussed hereinabove in regard to FIG. 8. Lead 2733 of element 2730 is connected to the cathode of a diode 2740. Lead 2733 of element 2730 and the cathode of diode 2740 also are electrically connected to each other and to the base of a transistor 2750.

A resistor 2755 is connected to the base of transistor 2750 by lead 2757, to lead 2733 of element 2730, and to the cathode of diode 2740. Lead 2758 of resistor 2755 is connected to $V_{DC1}$ at a point between $V_{DC1}$ and capacitor 2759. Capacitor 2759 is placed between lead 2758 and circuit ground. Collector lead 2753 of transistor 2750 is electrically connected to $V_{DC1}$. The emitter lead 2762 of transistor 2750 is electrically connected to the anode of diode 2740 and to the gate of power MOSFET 2763. Power MOSFET 2763 has its source electrically connected to $V_{DC1}$ and its drain electrically connected to the $V_{CC}$ line.

Pulse filter 2900 is the same as filters 900 and 1900 discussed above. Therefore, pulse filter 2900 will not be further described in detail here.

This alternative circuit operates in a manner similar to the first alternative embodiment of the invention discussed above, and may be summarized as follows. Resistors 2525 and 2540 regulate the current flowing through voltage monitor 2500, and transistor 2545 acts to compare $V_{CC}$ to the instantaneous voltage output of the current amplifying means 300 (or voltage amplifying means 200). More particularly, zener diode 2530 sets the operating voltage for the emitter of transistor 2545, depending on the level of $V_{CC}$. In addition, zener diode 2530 is selected so that (i) transistor 2545 is in saturation, or "on", when the instantaneous output voltage of the voltage amplifying means 200 (or the current amplifying means 300) at the base of transistor 2545 is sufficiently far below $V_{CC}$ (i.e., the instantaneous level of the voltage of the input powering current amplifying means 300) so as not to cause the current amplifying means to approach saturation, and (ii) transistor 2545 is not in saturation, or "off", when the instantaneous amplitude of the output voltage of the voltage amplifying means 200 (or the current amplifying means 300) at the base of transistor 2545 rises high enough relative to the instantaneous level of the voltage at the input powering current amplifying means 300 to cause the current amplifying means to approach saturation. In other words, the breakdown voltage $V_Z$ of zener diode 2530 is chosen so that when the instantaneous voltage at the base of transistor 2545 (i.e., the instantaneous output voltage of voltage amplifying means 200 (or the instantaneous output of current amplifying means 300) )is less than the value ($V_{CC}-V_Z-V_{BE}$), where $V_{BE}$ is the base-to-emitter forward voltage of transistor 2545, transistor 2545 will be "on", since this condition corresponds to the situation where current amplifying means 300 are not approaching saturation. At the same time, the breakdown voltage $V_Z$ of zener diode 2530 is chosen so that when the instantaneous voltage at the base of transistor 2545 (i.e., the instantaneous output voltage of voltage amplifying means 200 (or the instantaneous output of current amplifying means 300)) is greater than the value ($V_{CC}-V_Z-V_{BE}$), transistor 2545 will be "off", since this condition corresponds to the situation where current amplifying means 300 are approaching saturation and a power pulse is to be fired by pulse generating means 2400.

As a result of this construction, transistor 2545 will be "on" as long as the instantaneous output voltage of the current amplifying means 300 (or voltage amplifying means 200) remains sufficiently far below the instantaneous level of the voltage of the input powering current amplifying means 300 so as not to cause the current amplifying means to approach saturation. Further, it will be understood that (a) diode 2610, resistor 2611 and transistor 2612 provide a mechanism to fastly remove the storage charge at the base-emitter junction of transistor 2620 for speeding up the turn off speed of transistor 2620, and (b) zener diode 2627 establishes a low level, internal voltage reference standard for high speed switch 2600 by setting the emitter operating voltages of transistors 2620 and 2625 at the breakdown voltage of the zener diode 2627. Thus, when transistor 2545 is in the "on" state, and $V_{CC}$ exceeds the predetermined voltage $V_{DC2}$ which equals to ($V_{Z1}$) of zener diode 2530 plus the saturation voltage ($V_S$) of transistor 2543, plus the voltage drop ($V_R$) across resistor 2540, plus diode forward voltage ($V_d$) drop from diode 2610, base-emitter drop ($V_{BE}$) of transistor 2620, and plus ($V_{Z2}$) of zener diode 2627, —in equation form $V_{CC}=V_{DC2} \geqq (V_{Z1}+V_S+V_R+V_d+V_{BE}+V_{Z2})$—, then when the condition is met for $V_{CC}$ to exceed the above value defined by the equation, transistor 2620 will be turn "on", transistor 2625 will be "off", transistor 2750 will be "on", and power MOSTET 2763 will be "off".

However, when the instantaneous amplitude of the relatively high voltage signal rises high enough relative to the instantaneous level of the voltage of the input powering current amplifying means 300 to cause the current amplifying means to approach saturation, transistor 2545 is "off", transistor 2620 is "off", transistor 2625 is "on", transistor 2750 is "off". In this state of the circuit, diode 2740 is in conduction, and the gate voltage of power MOSFET 2763 falls, giving a forward bias to turn "on" power MOSFET 2763. When power MOSFET 2763 is "on", $V_{CC}$ rises very quickly to $V_{DC1}$, thereby supplying current amplifying means 300 with the higher voltage $V_{DC1}$ needed to prevent signal clipping.

In this alternative embodiment of the invention, as in the previously described embodiments, as soon as $V_{CC}$ rises to $V_{DC1}$ the instantaneous voltage present at the cathode of zener diode 2530 is once again high enough relative to the instantaneous amplitude of the relatively high voltage signal present at the base of transistor 2545 to turn transistor 2545 "on", transistor 2620 "on", and transistor 2625 "off". This change in state of voltage monitor 2500 and high speed switch 2600 cause power MOSFET 2763 to return to its "off" state, thereby permitting $V_{CC}$ to gradually return toward $V_{DC2}$. Hence, in this embodiment as well, at the moment the circuit boosts $V_{CC}$ so as to keep current amplifying means 300 out of saturation, the circuit starts to turn itself "off" so as to terminate the power pulse.

In addition, when the instantaneous amplitude of the relatively high voltage signal drops below $V_{CC}$ (or $V_{DC2}$)–$V_Z$–$V_{BE}$, where $V_Z$ is the breakdown voltage of zener diode 2530, $V_{BE}$ is the base-emitter voltage of transistor 2545 (such as during the intervals between input signals from the external source) transistor 2545 will remain "on" so long as the difference between $V_{CC}$ and the instantaneous output of the voltage amplifying means 200 (or the current amplifying means 300) exceeds the above-mentioned value. It is desirable, however, to maintain $V_{CC}$ at a minimum level, $V_{DC2}$, at all times. In the earlier embodiments described herein this is achieved by always supplying a minimum $V_{CC}$ directly from the power supply to current amplifying means 300 (see FIGS. 4 and 8).

A significant advantage of the embodiment of the present invention depicted in FIGS. 10 and 12 and discussed immediately above resides in the fact that the power supply is required to provide only a relatively high DC voltage, instead of both a relatively high DC voltage and a relatively low DC voltage (compare FIGS. 2 and 11). More particularly, the desired minimum voltage $V_{CC}$ that powers the current amplifying means 300 in absence of an applied signal voltage from an external source (or without the presence of relatively high level signal from the output of current amplifying means 300) is provided directly by the pulse generating means 2400, rather than by the relatively low DC voltage. Thus, when transistor 2545 is "on", but $V_{CC}$ is less than the predetermined value ($V_{DC2}$) set by the internal reference voltage standard of the high speed switch established by zener diode 2627, trigger transistor 2620 is "off"; trigger transistor 2625 is "on"; transistor 2750 is "off"; and power MOSFET 2763 is "on". This results in the generation of periodic high voltage pulses as disclosed above which maintain a preselected minimum, substantially constant, average $V_{CC}$ at all times. Accordingly, substantial reductions in power supply cost with only minimal increases in linear power amplifier component costs may be achieved.

In other words, when the voltage applied to the base of trigger transistor 2620 drops below the preselected internal reference voltage standard established by zener diode 2627 biasing the emitters of trigger transistors 2620 and 2625, trigger transistor 2620 is switched "off" and trigger transistor 2625 is switched "on". As discussed in detail above, this causes $V_{CC}$ to be immediately raised to $V_{DC1}$. However, as soon as $V_{CC}$ is raised to $V_{DC1}$, the conditions which caused the generation of a high voltage pulse are reversed, and $V_{CC}$ is allowed to discharge until it again drops below an average value $V_{DC2}$. It has been found that by the judicious selection of circuit components, a desired substantially constant average value of $V_{CC}$ may be maintained at $V_{DC2}$. Hence, depending upon the requirements of the circuit components selected and/or the characteristics of the linear power amplifier required, the voltage powering the current amplification means within the scope of the invention either (1) may always be provided by the pulse generating means 2400, or (2) may be provided by the low level DC voltages from a linear power supply during low signal level or period of no signal and by high voltage when there is a relatively high level signal from the current generating means.

Figure 9:
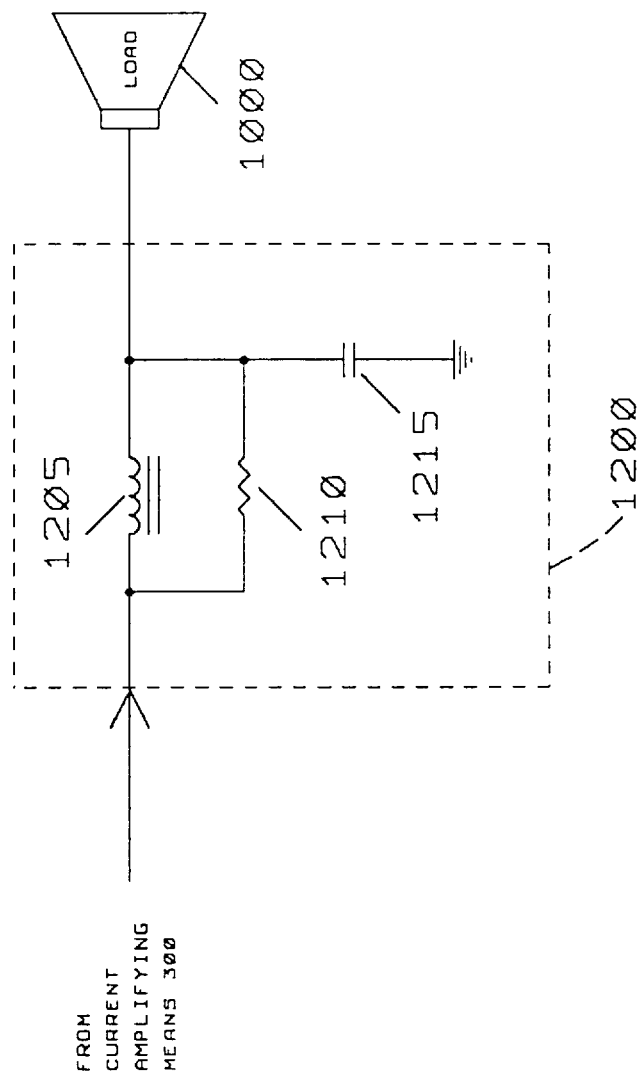
FIG. 9 is a schematic diagram illustrating a low pass filter which may be used in conjunction with the invention.

In the foregoing description of the invention, reference has been made to the low pass filter 1200 which is interconnected between current amplifying means 300 and load 1000 (see FIGS. 1, 3, 7 and 10). As seen in FIG. 9, low pass filter 1200 comprises an inductor 1205, a resistor 1210 and a capacitor 1215. The time constant of low pass filter 1200 is selected so that it has a cut-off frequency more than five times the audio bandwidth involved. In this way low pass filter 1200 will not adversely affect the frequency response of the linear amplifier within the bandwidth of interest, yet will be effective to further reduce residual pulse noise present at the output of current amplifier means 300.

Since certain changes may be made in the preferred embodiments described above without departing from the scope of the present invention in its broadest aspects, it is intended that all matter contained in the above descriptions or shown in the accompanying drawings shall be interpreted in an illustrative and not in a limiting sense.

What is claimed is:

1. A linear power amplifier having a pulse density modulated switching power supply comprising:

power supply means for providing a relatively high DC voltage output;

voltage amplifying means for receiving a relatively low voltage signal from an external source and amplifying said relatively low voltage signal so as to create a relatively high voltage output signal;

current amplifying means for receiving said relatively high voltage output signal and increasing the current flow associated with said relatively high voltage output signal, as needed, in order to properly drive a load, said current amplifying means being powered by pulse generation means for intermittently creating electrical pulses having a relatively high DC voltage;

said pulse generating means (1) including an internal reference voltage standard, (2) being connected to a first line carrying said relatively high voltage signal to said load and to a second line supplying power to said current amplifying means, and (3) being adapted to (i) compare the instantaneous voltage amplitude of said relatively high voltage output signal with the instantaneous voltage level powering said current amplifying means, (ii) provide fixed duration pulses, at said relatively high DC voltage, to power said current amplifying means whenever, and so long as, the instantaneous voltage amplitude of said relatively high voltage output signal rises high enough relative to the instantaneous voltage level powering said current amplifying means to cause said current amplifying means to approach saturation, (iii) compare said instantaneous voltage level powering said current amplifying means with said internal reference voltage standard, and (iv) provide fixed duration pulses at said relatively high DC voltage to power said current amplifying means whenever, and as long as, said instantaneous voltage level powering said current amplifying means is below the level of said internal reference voltage standard.

2. A linear power amplifier according to claim 1 wherein said power supply means comprise a dual polarity power supply.

3. A linear power amplifier according to claim 1 wherein said voltage amplifying means comprise a linear voltage amplifier.

4. A linear power amplifier according to claim 1 wherein said current amplifying means comprise at least two current gain transistors.

5. A linear power amplifier according to claim 1 wherein said pulse generating means provide said pulses of said relatively high DC voltage in sufficient number and with sufficient frequency, and said relatively high DC voltage is selected so as to be high enough relative to the voltage amplitude of said relatively high voltage signal, to prevent said current amplifying means from reaching saturation.

6. A linear power amplifier according to claim 1 wherein said linear power amplifier further comprises pulse filter means connected between said pulse generating means and said current amplifying means, said pulse filter means being adapted to condition the profile of each pulse so as to apply a signal-approximated power waveform to said current amplifying means.

7. A linear power amplifier according to claim 1 wherein said pulse generating means comprise a high speed switch and a power switch, and further wherein said high speed switch is adapted to change states when the instantaneous voltage amplitude of said relatively high voltage output signal rises high enough relative to the instantaneous voltage level powering said current amplifying means to cause said current amplifying means to approach saturation, and further wherein said power switch is adapted to provide said pulses of said relatively high DC voltage to power said current amplifying means in response to a change in state of said high speed switch.

8. A linear power amplifier according to claim 1 wherein said pulse generating means comprise a voltage monitor with bi-state impedance, and further wherein said voltage monitor with bi-state impedance is adapted to change impedance states when the Instantaneous voltage amplitude of said relatively high voltage signal rises high enough relative to the instantaneous voltage level powering said current amplifying means to cause said current amplifying means to approach saturation.

9. A linear power amplifier according to claim 8 wherein said pulse generating means comprise a high speed switch adapted to change state in response to a change in the impedance state of said voltage monitor with bi-state impedance.

10. A linear power amplifier according to claim 9 wherein said pulse generating means further comprise a power switch adapted to provide pulses of said relatively high DC voltage to power said current amplifying means in response to a change of state of said high speed switch.

11. A linear power amplifier according to claim 10 wherein said power switch comprises a power MOSFET.

12. A linear power amplifier according to claim 1 wherein said amplifier further comprises a low pass filter interconnected between said current amplifying means and said load.

13. A method for operating a linear power amplifier of the sort comprising (i) power supply means for providing a relatively high DC voltage output; (ii) voltage amplifying means for amplifying a relatively low voltage signal received from an external signal source into a relatively high voltage signal; and (iii) current amplifying means connected to said voltage amplifying means for increasing the current flow associated with said relatively high voltage output signal, as needed, in order to properly drive a load, wherein said current amplifying means are powered by a pulse generation means including an internal reference voltage standard;

wherein said method comprises the steps of:
(1) comparing the instantaneous level of voltage powering said current amplifying means with the instantaneous voltage amplitude of said relatively high voltage signal and with said internal reference voltage;
(2) providing a fixed duration pulse, at said relatively high DC voltage, to power said current amplifying means when either (i) the instantaneous voltage amplitude of said relatively high voltage signal is high enough relative to the instantaneous voltage level powering said current amplifying means to cause said current amplifying means to approach saturation, or (ii) the instantaneous level of voltage powering said current amplifying means is less than said internal reference voltage level standard; and
(3) returning to Step 1.

14. Pulse generating means for use in a linear power amplifier of the sort comprising: power supply means for providing a relatively high DC output voltage; voltage amplifying means for receiving a relatively low voltage signal from an external signal source and amplifying said relatively low voltage signal into a relatively high voltage output signal; and current amplifying means for receiving said relatively high voltage output signal from said voltage amplifying means and increasing the current flow associated with said relatively high voltage output signal, as needed, in order to properly drive a load; said current amplifying means being powered by a pulse generating means;

said pulse generating means including an internal reference voltage standard, a first input for receiving said relatively high voltage signal, a second input for receiving a voltage signal equal to the voltage powering said current amplifying means, an output, and means for (i) comparing the instantaneous voltage amplitude of said relatively high voltage signal with the instantaneous voltage level powering said current amplifying means, (ii) providing fixed duration output pulses, at said relatively high DC voltage, to power said current amplifying means whenever, and so long as, the instantaneous voltage amplitude of said relatively high voltage signal rises high enough relative to the instantaneous voltage level powering said current amplifying means to cause said current amplifying means to approach saturation, (iii) comparing the instantaneous voltage level powering said current amplifying means with said internal reference voltage standard, and (iv) providing fixed duration output pulses at said relatively high DC voltage to power said current amplifying means whenever, and so long as, said instantaneous voltage level powering said current amplifying means is less than the level of said internal reference voltage standard.

* * * * *